(12) United States Patent
Kawada

(10) Patent No.: US 7,603,766 B2
(45) Date of Patent: Oct. 20, 2009

(54) ELECTRONIC-COMPONENT HOLDING APPARATUS AND MOUNTING SYSTEM

(75) Inventor: Tosuke Kawada, Chiryu (JP)

(73) Assignee: Fuji Machine MFG. Co., Ltd., Chiryu (JP)

( * ) Notice: Subject to any disclaimer, the term of this patent is extended or adjusted under 35 U.S.C. 154(b) by 337 days.

(21) Appl. No.: 11/360,666

(22) Filed: Feb. 24, 2006

(65) Prior Publication Data

US 2006/0207090 A1 Sep. 21, 2006

(30) Foreign Application Priority Data

Mar. 16, 2005 (JP) .............................. 2005-075397

(51) Int. Cl.
*B23P 19/00* (2006.01)
(52) U.S. Cl. .............................. 29/743; 29/739; 901/40
(58) Field of Classification Search ........... 29/739–741, 29/743, 832; 198/471.1; 414/752.1; 901/40; 294/64.1
See application file for complete search history.

(56) References Cited

U.S. PATENT DOCUMENTS

| 4,794,689 A | 1/1989 | Seno et al. | |
|---|---|---|---|
| 4,875,285 A | 10/1989 | Haan et al. | |
| 4,979,286 A * | 12/1990 | Nakayama et al. | ............ 29/740 |
| RE35,027 E | 8/1995 | Ragard | |
| 5,864,944 A | 2/1999 | Kashiwagi et al. | |
| 5,878,484 A | 3/1999 | Araya et al. | |
| 5,960,534 A | 10/1999 | Yazawa et al. | |
| 6,276,051 B1 | 8/2001 | Asai et al. | |
| 6,380,537 B1 * | 4/2002 | Suhara et al. | ............... 250/239 |
| 6,678,944 B1 | 1/2004 | Kawada | |
| 6,851,733 B2 * | 2/2005 | Mori et al. | .................... 29/743 |
| 7,032,303 B2 | 4/2006 | Kawada | |

FOREIGN PATENT DOCUMENTS

| EP | 0 691 804 A1 | 1/1996 |
|---|---|---|
| JP | A 6-196546 | 7/1994 |
| JP | A 6-291490 | 10/1994 |
| JP | A 6-296092 | 10/1994 |
| JP | A 6-296093 | 10/1994 |
| JP | A 2004-221518 | 8/2004 |

\* cited by examiner

*Primary Examiner*—Donghai D. Nguyen
(74) *Attorney, Agent, or Firm*—Oliff & Berridge, PLC

(57) ABSTRACT

An electronic-component holding apparatus and an electronic-component mounting system each of which assures that a nozzle head holding a plurality of suction nozzles is easily attached to, and detached from, a head holding member, are provided. A suction surface of a head holding member is held in close contact with a to-be-sucked surface of a revolver head so as to define a head-related negative-pressure chamber that holds the revolver head by utilizing suction. The revolver head is revolved, and moved upward and downward, with the head holding member.

18 Claims, 12 Drawing Sheets

ELECTRONIC-COMPONENT HOLDING APPARATUS AND MOUNTING SYSTEM

The present application is based on Japanese Patent Application No. 2005-075397 filed on Mar. 16, 2005, the contents of which are incorporated herein by reference.

BACKGROUND OF THE INVENTION

1. Field of the Invention

The present invention relates to an electronic-component holding apparatus, an electronic-component mounting system, and an electronic-component mounting method, and particularly to an electronic-component holding apparatus including a plural-nozzle head that holds a plurality of suction nozzles adapted to hold respective electronic components, and a head holding member that holds the plural-nozzle head such that the plural-nozzle head is detachable from the head holding member; an electronic-component mounting system including the electronic-component holding apparatus; and an electronic-component mounting method using the electronic-component holding apparatus.

2. Discussion of Related Art

An example of the above-indicated electronic-component holding apparatus is disclosed by, e.g., Japanese Patent Application Publication No. 2004-221518. The electronic-component holding apparatus is employed by an electronic-component mounting system, and includes a head holding member that selectively holds an arbitrary one of different sorts of nozzle heads. The different sorts of nozzle heads hold different sorts and/or numbers of suction nozzles. Therefore, the head holding member selectively holds an appropriate one of the different nozzle heads that holds one or more suction nozzles corresponding to a sort or sorts, and/or a total number, of electronic components to be mounted on a circuit substrate.

The head holding member is provided with a head clamping device including an engaging pin and an engaging-pin operating device. The engaging-pin operating device includes a cam plate, and a rod member that is operable by an operator to rotate the cam plate and thereby move the engaging pin upward and downward. When a nozzle head is held by the head holding member, the operator rotates the cam plate so as to retract the engaging pin to its retracted position and, in this state, the nozzle head is attached to the head holding member. Then, the cam plate is rotated in a reverse direction so as to move the engaging pin to its operative position where the pin engages a roller provided in the nozzle head attached. When the nozzle head is removed from the head holding member, the operator operates in a reverse order, so that the engaging pin is disengaged from the roller and the nozzle head is detached from the head holding member.

However, it is cumbersome to attach the nozzle head to the nozzle holding member while operating the head clamping device. That is, it is time-consuming to attach and detach, while operating the head clamping device, the nozzle head to and from the nozzle holding member, which may lead to lowering an efficiency of mounting of electronic components.

SUMMARY OF THE INVENTION

It is therefore an object of the present invention to provide an electronic-component holding apparatus, an electronic-component mounting system, and an electronic-component mounting method each of which enjoys an advantage that a nozzle head is easily attached to, and detached from, a head holding member.

Hereinafter, some examples of various modes of the present invention that are recognized as being claimable in the present application (hereinafter, referred to as the claimable modes, where appropriate) will be described and explained. The claimable modes include at least respective modes corresponding to the appended claims, but may additionally include broader or narrower modes of the present invention or even one or more different inventions than the present invention. Each of the following modes (1) through (37) is numbered like the appended claims, and depends from the other mode or modes, where appropriate, so as to help understand the claimable modes and to indicate and clarify possible combinations of elements or technical features thereof. It is, however, to be understood that the present invention is not limited to the elements or technical features of the following modes, or the combinations thereof, that will be described below for illustrative purposes only. It is to be further understood that each of the following modes should be construed in view of not only the explanations directly associated therewith and but also the detailed description of the preferred embodiments of the present invention, and that in additional claimable modes, one or more elements or one or more technical features may be added to, or deleted from, any of the following specific modes. In the following modes, the mode (1) corresponds to claim 1; the mode (2) corresponds to claim 2; the mode (3) corresponds to claim 3; the mode (4) corresponds to claim 4; a combination of the modes (5) and (9) corresponds to claim 5; the mode (10) corresponds to claim 6; the mode (16) corresponds to claim 7; a combination of the modes (20) and (21) corresponds to claim 8; the mode (22) corresponds to claim 9; the mode (27) corresponds to claim 10; the mode (28) corresponds to claim 11; a combination of the modes (11) and (29) corresponds to claim 12; the mode (30) corresponds to claim 13; the mode (32) corresponds to claim 14; the mode (36) corresponds to claim 15; and the mode (37) corresponds to claim 16.

(1) An electronic-component holding apparatus, comprising:

at least one plural-nozzle head which holds a plurality of suction nozzles such that the suction nozzles extend parallel to each other and hold respective electronic components, wherein said at least one plural-nozzle head includes a to-be-held portion; and a head holding member including a head holding portion which selectively holds an arbitrary one of said at least one plural-nozzle head by holding the to-be-held portion thereof, wherein at least one of the head holding portion and the to-be-held portion has a negative-pressure-chamber defining recess which is connected to a head-related negative-pressure supply passage and which cooperates with an other of the head holding portion and the to-be-held portion to define a head-related negative-pressure chamber which is supplied with a head-related negative pressure through the head-related negative-pressure supply passage and which holds, by suction, the to-be-held portion of the arbitrary plural-nozzle head.

In the case where the plural-nozzle head is a multiple-nozzle head holding at least three suction nozzles, the multiple-nozzle head may be one in accordance with the mode (2), described below. Otherwise, the multiple-nozzle head may be one holding at least three suction nozzles along a straight line such that the at least three suction nozzles extend parallel to each other in a direction perpendicular to the straight line; or one holding at least three suction nozzles at at least three intersection points, respectively, that are selected from at least four intersection points of (a) a plurality of first straight lines and (b) a plurality of second straight lines, such that the at least three suction nozzles extend parallel to each other in a direction perpendicular to the first and second straight lines.

The plural-nozzle head is sucked and held by the head holding member, owing to the negative pressure supplied to the head-related negative-pressure chamber. Therefore, when the plural-nozzle head is held by the head holding member, the head and the holding member cooperate with each other to define the head-related negative-pressure chamber, and the negative pressure is supplied to the chamber; and when the head is removed from the holding member, the head and the holding member are separated from each other by stopping the supplying of the negative pressure to the chamber. Thus, the plural-nozzle head can be easily attached to, and detached from, the head holding member. In addition, the plurality of suction nozzles held by the plural-nozzle head are attached to, and detached from, the head holding member, all at once, when the head is attached to, and detached from, the holding member. Therefore, the plurality of suction nozzles can be easily attached to, and detached from, the head holding member, or can be easily exchanged with other suction nozzles, in a short time.

The attaching and detaching of the plural-nozzle head to and from the head holding member may be carried out either manually by an operator, or automatically by an attaching and detaching device. In the latter case, the plural-nozzle head can be more easily attached to, and detached from, the head holding member.

In the case where the present electronic-component holding apparatus comprises a plurality of plural-nozzle heads, it is preferred that those plural-nozzle heads be of different sorts such that those heads hold suction nozzles at different pitches or intervals and/or hold different sorts and/or numbers of suction nozzles corresponding to various sorts of electronic components to be held thereby, that is, such that those heads hold suction nozzles with a high space-use efficiency. In this case, the detaching of one plural-nozzle head from the head holding member and the attaching of another plural-nozzle head to the holding member mean the exchanging of the two plural-nozzle heads with each other; and the above-indicated attaching and detaching device functions as an automatic head-exchanging device.

(2) The apparatus according to the mode (1), wherein said at least one plural-nozzle head comprises at least one multiple-nozzle head which holds at least three said suction nozzles such that said at least three suction nozzles are located on a common circle and extend parallel to each other in a direction perpendicular to a plane containing the common circle.

(3) The apparatus according to the mode (1) or the mode (2), wherein said at least one plural-nozzle head has a first negative-pressure supplying system which supplies a nozzle-related negative pressure to each of the suction nozzles; and a first positive-pressure supplying system which supplies a positive pressure to said each suction nozzle, and the head holding member has a second negative-pressure supplying system and a second positive-pressure supplying system which communicate with the first negative-pressure supplying system and the first positive-pressure supplying system, respectively, in a state in which the head holding member holds the arbitrary plural-nozzle head.

When each one of the suction nozzles is supplied with negative pressure, the each nozzle holds, by suction, an electronic component; and when the each nozzle is supplied with positive pressure, the each nozzle releases the component, or an inner space of the each nozzle is cleaned. According to the present mode (3), in the state in which the plural-nozzle head is held by the head holding member, each of the negative pressure and the positive pressure can be easily supplied to each of the suction nozzles. Thus, the present holding apparatus effectively utilizes the technical advantage that the head holding member holds, by suction, the plural-nozzle head.

Here, it is noted that each of the present mode (3) and the following modes (5) through (33) can be embodied independent of each of the foregoing modes (1) and (2).

(4) The apparatus according to the mode (3), wherein the first negative-pressure supplying system and the second negative-pressure supplying system communicate with each other via the negative-pressure-chamber defining recess, and the head-related negative-pressure supply passage provides at least a portion of a nozzle-related negative-pressure supply passage of the second negative-pressure supplying system.

The second negative-pressure supplying system and the head-related negative-pressure supply passage may be provided independent of each other. However, according to the present mode (4), the head holding member can enjoy a simplified construction.

(5) The apparatus according to the mode (3) or the mode (4), wherein said at least one plural-nozzle head further has a plurality of valve devices which are associated with the suction nozzles, respectively, and each of which is switchable to an arbitrary one of at least two states including (a) a first state in which said each valve device allows a corresponding one of the suction nozzles to communicate with the first negative-pressure supplying system and (b) a second state in which said each valve device allows said corresponding suction nozzle to communicate with the first positive-pressure supplying system.

According to the present mode (5), the supplying of negative pressure to each suction nozzle and the supplying of positive pressure to the each nozzle can be easily switched to and from each other by a corresponding one of the valve devices. Each of the valve devices may be either one that carries out the switching operation electrically, or one that carries out the switching operation mechanically.

(6) The apparatus according to the mode (5), wherein said at least one plural-nozzle head further has a main body which includes a plurality of nozzle holding portions holding the suction nozzles, respectively; a plurality of valve-device holding portions holding the valve devices, respectively; and the to-be-held portion to be held, by suction, by the head holding member.

(7) The apparatus according to the mode (6), further comprising a moving device which moves at least one of said each suction nozzle and the main body, relative to an other of said each suction nozzle and the main body, in each of an upward direction and a downward direction that are parallel to a direction in which said each suction nozzle extends.

According to the present mode (7), at least one of the suction nozzles, held by the plural-nozzle head, can be selected so that the selected at least one suction nozzle may be moved upward and downward to suck and mount at least one electronic component. The moving device may be one that carries out the moving operation electrically, or one that carries out the moving operation mechanically.

(8) The apparatus according to any of the modes (5) through (7), further comprising at least one valve switching device which switches said each valve device to the arbitrary one of said at least two states including the first state and the second state.

The present electronic-component holding apparatus may employ a plurality of valve switching devices that switch the valve devices, respectively, or a common valve switching device that switches each of the valve devices. In the latter case, the present holding apparatus can enjoy a simpler construction.

(9) The apparatus according to any of the modes (5) through (8), further comprising:

a main frame which holds the head holding member such that the head holding member is movable relative to the main frame in each of an upward direction and a downward direction that are parallel to a reference direction in which said each suction nozzle extends; and a head-holding-member moving device which moves the head holding member relative to the main frame in said each of the upward direction and the downward direction.

According to the present mode (9), the plural-nozzle head can be moved upward and downward by moving the head holding member upward and downward, respectively.

(10) The apparatus according to the mode (9), further comprising a valve switching device which is held by the main frame and which mechanically switches, owing to a movement of the head holding member relative to the main frame by the head-holding-member moving device, said each valve device to the arbitrary one of said at least two states including the first state and the second state.

According to the present mode (10), each of the valve devices is mechanically switchable to each of a positive-pressure supply state thereof and a negative-pressure supply state thereof. In contrast, in the case where the switching of each valve device is electrically done, the plural-nozzle head and the head holding member need to have respective electric wirings for the electric valve devices, and need to be electrically connected to each other when the head is held by the holding member. Thus, the present electronic-component holding apparatus can switch the supplying to each suction nozzle of the negative pressure to and from the supplying to the each nozzle of the positive pressure, without damaging the advantage that the head is held, by suction, by the holding member. In addition, the valve switching device can enjoy a simple construction, owing to the utilization of the upward and downward movements of the head holding member.

(11) The apparatus according to the mode (10), wherein said each valve device includes at least one valve spool which includes a to-be-engaged portion and which is held by a main body of said at least one plural-nozzle head such that said at least one valve spool is movable in the reference direction, and wherein the valve switching device includes a valve switching member which engages, when the head holding member is moved in the downward direction, the to-be-engaged portion of said at least one valve spool and thereby moves said at least one valve spool relative to the main body of said at least one plural-nozzle head in the reference direction.

(12) The apparatus according to the mode (11), wherein the to-be-engaged portion of said at least one valve spool has a plurality of to-be-engaged surfaces which have a plurality of stepwise different positions, respectively, in the reference direction.

Since the valve switching member engages a selected one of the plurality of to-be engaged surfaces of the valve spool of each valve device, the switching of the each valve device occurs at a selected one of different timings during the downward movement of the head holding member.

(13) The apparatus according to the mode (11) or the mode (12), wherein said each valve device further includes a spool-position maintaining device which maintains said at least one valve spool at a position to which said at least one valve spool has been moved by the valve switching member.

According to the present mode (13), the valve spool of each valve device can be reliably maintained at a position to which it has been moved, and accordingly the supplying, and stopping of supplying, of each of the positive pressure and the negative pressure to each suction nozzle can be accurately carried out.

(14) The apparatus according to the mode (13), wherein the spool-position maintaining device of said each valve device includes an asymmetric pressure chamber which opens in an inner circumferential surface of at least one spool hole which is formed in the main body of said at least one plural-nozzle head and in which said at least one valve spool fits, and wherein the asymmetric pressure chamber has a shape assuring that a pressure is applied to said at least one valve spool, asymmetrically with respect to an axis line thereof.

According to the present mode (14), the valve spool of each valve device is pressed against the inner circumferential surface of the spool hole by the pressure applied to the valve spool in a direction from one of opposite sides of the axis line thereof toward the other side, and the current position of the valve spool is maintained owing to a frictional force produced between the valve spool and the inner surface. Therefore, the present spool-position maintaining device can enjoy a long lifetime, as compared with a case where a mechanical brake device is used to maintain the position of the valve spool.

(15) The apparatus according to any of the modes (5) through (14), wherein said at least one plural-nozzle head further has a plurality of individual passages each of which connects a corresponding one of the suction nozzles to the first negative-pressure supplying system, and wherein said each valve device includes (A) a first valve which is provided in a corresponding one of the individual passages, includes a first valve spool, and is switchable to an arbitrary one of (a) a negative-pressure supply state thereof in which the first valve allows said corresponding suction nozzle to communicate with the first negative-pressure supplying system, and (b) a positive-pressure supply state thereof in which the first valve allows said corresponding suction nozzle to communicate with the first positive-pressure supplying system, and (B) a second valve which is provided between the first valve and the first positive-pressure supplying system, includes a second valve spool, and is switchable to an arbitrary one of (c) a negative-pressure supply state thereof in which the second valve allows the first valve to communicate with the first negative-pressure supplying system, and (d) a negative-pressure-supply inhibiting state in which the second valve inhibits the first valve from communicating with the first positive-pressure supplying system.

According to a combination of respective selected states of the first and second valves of each of the valve devices, the negative pressure or the positive pressure is supplied to a corresponding one of the suction nozzles, or the supplying of the negative or positive pressure is stopped. However, each valve device may be one that is switchable, owing to a single valve, to an arbitrary one of three states, i.e., a positive-pressure supply state, a negative-pressure supply state, and a positive-and-negative-pressure-supply inhibiting state. According to the present mode (15), since each valve device employs two valve spools, the each valve device can be easily switched by moving each of the two valve spools to an arbitrary one of two positions.

(16) The apparatus according to any of the modes (9) through (14), further comprising a nozzle moving device which is held by the main frame and which mechanically moves, owing to a movement of the head holding member relative to the main frame by the head-holding-member moving device, an arbitrary one of the suction nozzles relative to a main body of said at least one plural-nozzle head in said each of the upward direction and the downward direction.

According to the present mode (16), the nozzle moving device can enjoy a simple construction owing to the utilization of upward and downward movements of the head holding member. In addition, since each suction nozzle and the main body are mechanically moved relative to each other, the plural-nozzle head and the head holding member need not be electrically connected to each other when the head is held by the holding member.

(17) The apparatus according to the mode (16), wherein said at least one plural-nozzle head further has a plurality of pivotable levers each of which includes two arms one of which is operatively connected to a corresponding one of the suction nozzles, and said each pivotable lever is held by the main body such that said each pivotable lever is pivotable about an axis line which is perpendicular to, and is distant from, an axis line of said corresponding suction nozzle, and wherein the nozzle moving device includes a lever drive member which engages an other of the two arms of said each pivotable lever and thereby pivots said each pivotable lever about the axis line thereof.

(18) The apparatus according to the mode (17), wherein the lever drive member provides a valve switching member which switches, owing to the movement of the head holding member relative to the main frame, said each valve device to the arbitrary one of said at least two states including the first state and the second state.

When each suction nozzle and the main body of the plural-nozzle head are moved relative to each other, it is often needed to switch the supplying of a gas to the each nozzle. Since it is easy to provide the lever drive member that also functions as the valve switching member, the present electronic-component holding apparatus can enjoy a simplified construction.

(19) The apparatus according to any of the modes (3) through (18), wherein the first positive-pressure supplying system includes a pressure reducing valve which is switchable to an arbitrary one of an operative state in which the pressure reducing valve reduces the positive pressure, and an inoperative state in which the pressure reducing valve does not reduce the positive pressure.

According to the present mode (19), each suction nozzle can be selectively supplied with a reduced positive pressure, or a positive pressure that is not reduced. The pressure reducing valve may be an electromagnetic pressure-adjusting valve that electrically reduces, in its operative state, the positive pressure, or a mechanical valve that mechanically carries out the pressure reducing operation. In the latter case, the plural-nozzle head and the head holding member need not be electrically connected to each other when the head is held by the holding member. In addition, the switching of the pressure reducing valve between its operative and inoperative states may be done electrically, mechanically, or manually.

(20) The apparatus according to any of the modes (1) through (19), wherein said at least one plural-nozzle head has a main body including a laminated portion which is constituted by a plurality of plates members which have different gas passages and which are gas-tightly laminated on each other.

The plurality of plate members may be combined with each other by a removable, combining member, such as a bolt, such that the plate members are separable from each other; or alternatively the plate members may be permanently fixed to each other with, e.g., an adhesive such that the plate members are not separable from each other. Moreover, the plate members may be united with each other by using both the combining method and the fixing method. For example, in the case where the plate members are basically united with each other by the fixing method and only one or more (but not all) plate members are united with the thus fixed plate members by the combining method, it is easy to assemble one or more constituent elements into the plural-nozzle head, and remove one or more constituent elements from the head. In the plural-nozzle head, the main body needs to have a plurality of negative-pressure supply passages that supply the negative pressure to the suction nozzles, respectively. It is, however, not easy to form, in the plural-nozzle head, the negative-pressure supply passages such that those supply passage do not interfere with each other. According to the present mode (20), the laminated portion is employed as at least a portion of the main body. Therefore, the negative-pressure supply passages can be easily formed by combining the respective groups of gas passages of the plate members with each other. In addition, in the case where each suction nozzle is supplied with the positive pressure through a corresponding one of a plurality of negative-pressure supply passages, the present holding apparatus can enjoy an enhanced advantage that all the supply passages can be easily formed.

(21) The apparatus according to the mode (20), wherein the laminated portion is constituted by at least three said sheets members.

The greater the total number of the plate members is, the higher the degree of freedom of forming of the gas passages is, that is, the easier it is to form the gas passages.

(22) The apparatus according to the mode (20) or the mode (21), wherein at least one of the plate members has, in at least one of opposite surfaces thereof, a plurality of grooved portions each of which extends parallel to said at least one surface, and a plurality of through holes each of which is formed through a thickness of said at least one plate member.

When the plate members are laminated on each other, the grooved portions and the through passages are closed, and/or are communicated with each other to define the gas passages and thereby constitute the positive-pressure supply passages and the negative-pressure supply passages.

(23) The apparatus according to the mode (22), wherein said at least one plural-nozzle head comprises at least one multiple-nozzle head which holds at least three said suction nozzles such that said at least three suction nozzles are located on a common circle and extend parallel to each other in a reference direction perpendicular to a plane containing the common circle, and wherein each of the grooved portions comprises at least one of (a) a circumferential-direction groove extending in a circumferential direction of the common circle and (b) a radial-direction groove extending in a substantially radial direction of the common circle.

The respective radial-direction grooves of the grooved portions are passages each of which connects between an inner portion of the main body that is near to the center of the common circle, and an outer portion thereof that is remote from the center. To this end, each radial-direction groove is just required to extend in a radial direction of the common circle. However, depending upon a relative-positional relationship between the inner and outer portions to be connected by the each radial-direction groove, and/or a need to avoid interference of the each groove with another portion of the main body, the each groove may need to be more or less inclined relative to a radial direction of the common circle. Therefore, here, the phrase "a substantially radial direction" is defined as encompassing an angular range of ±30 degrees with respect to a radial direction of the common circle.

(24) The apparatus according to the mode (22) or the mode (23), wherein said at least one plural-nozzle head comprises at least one multiple-nozzle head which holds at least three said suction nozzles such that said at least three suction nozzles are located on a common circle and extend parallel to each other in a reference direction perpendicular to a plane containing the common circle, and wherein the grooved portions comprises an annular groove which is formed along a circle which is concentric with the common circle.

(25) The apparatus according to any of the modes (1) through (24), wherein said at least one plural-nozzle head comprises at least one multiple-nozzle head which holds at least three said suction nozzles such that said at least three suction nozzles are located on a common circle and extend parallel to each other in a reference direction perpendicular to a plane containing the common circle, and wherein said at least one multiple-nozzle head has a plurality of valve devices each of which controls supplying of each of a nozzle-related negative pressure and a positive pressure to a corresponding one of the suction nozzles, and said each of which is provided on a radially outer side of said corresponding suction nozzle with respect to the common circle.

Since the outer side of each suction nozzle is wider than the inner side thereof, the corresponding valve device can be easily provided on the outer side of the each nozzle.

(26) The apparatus according to any of the modes (1) through (25), wherein said at least one plural-nozzle head comprises at least one multiple-nozzle head which holds at least three said suction nozzles such that said at least three suction nozzles are located on a common circle and extend parallel to each other in a reference direction perpendicular to a plane containing the common circle, and wherein the apparatus further comprises a head rotating device which rotates said at least one multiple-nozzle head about an axis line extending perpendicularly to said plane and passing through a center of the common circle.

This multiple-nozzle head is a rotatable multiple-nozzle head, and accordingly can be said as a revolver head. Rotation of the multiple-nozzle head may be utilized to move each suction nozzle and thereby change the current angular position thereof to a pre-selected angular position thereof, or correct or change an angular position of the electronic component held by each suction nozzle.

(27) The apparatus according to the mode (10) or the mode (11), wherein said at least one plural-nozzle head comprises at least one multiple-nozzle head which holds at least three said suction nozzles such that said at least three suction nozzles are located on a common circle and extend parallel to each other in a direction perpendicular to a plane containing the common circle, wherein the valve switching device is held by the main frame such that the valve switching device is revolveable about an axis line thereof extending perpendicularly to said plane and passing through a center of the common circle, and wherein the apparatus further comprises a valve-switching-device revolving device which revolves the valve switching device to an arbitrary angular phase about the axis line thereof.

According to the present mode (27), the valve switching device can be moved to each of respective angular phases where the valve switching device can switch the valve devices. Thus, the present valve switching device is commonly used with each of the valve devices.

(28) The apparatus according to any of the modes (16) through (18), wherein said at least one plural-nozzle head comprises at least one multiple-nozzle head which holds at least three said suction nozzles such that said at least three suction nozzles are located on a common circle and extend parallel to each other in a reference direction perpendicular to a plane containing the common circle, wherein the nozzle moving device is held by the main frame such that the nozzle moving device is revolveable about an axis line thereof extending perpendicularly to said plane and passing through a center of the common circle, and wherein the apparatus further comprises a nozzle-moving-device revolving device which revolves the nozzle moving device to an arbitrary angular phase about the axis line thereof.

According to the present mode (28), the nozzle moving device can be moved to each of respective angular phases where the nozzle moving device can move the suction nozzles. Thus, the nozzle moving device is commonly used with each of the suction nozzles.

(29) The apparatus according to any of the modes (11) through (14), further comprising an ordinary resetting member which is held by the main frame and which engages, when the head holding member is moved upward, relative to the main frame, to an ordinary resetting position, said at least one valve spool of said each valve device, and thereby resets said at least one valve spool to a reference position thereof.

According to the present mode (29), the upward movement of the head holding member is utilized to reset the valve spool of each valve device to its reference position.

(30) The apparatus according to the mode (29), further comprising a special resetting member which is held by the main frame and which engages, when the head holding member is moved upward, relative to the main frame, to a special resetting position, said at least one valve spool of an arbitrary one of the valve devices, and thereby resets said at least one valve spool to the reference position thereof.

With the special resetting member, only the valve spool of a valve device corresponding to, e.g., the suction nozzle that has failed to hold normally an electronic component, can be reset to its reference position. Generally, the upward movement of the head holding member is utilized to reset the valve spool of an arbitrary one of the valve-devices to its reference position. In comparison with the special resetting member in accordance with the present mode (30), the resetting member in accordance with the above-described mode (29) can be said as an ordinary resetting member.

(31) The apparatus according to the mode (30), wherein said at least one plural-nozzle head comprises at least one multiple-nozzle head which holds at least three said suction nozzles such that said at least three suction nozzles are located on a common circle and extend parallel to each other in a reference direction perpendicular to a plane containing the common circle, wherein the special resetting member is held by the main frame such that the special resetting member is revolveable about an axis line thereof extending perpendicularly to said plane and passing through a center of the common circle, and wherein the apparatus further comprises a special-resetting-member revolving device which revolves the special resetting member to an arbitrary angular phase about the axis line thereof.

(32) The apparatus according to the mode (30) or the mode (31), further comprising a special valve switching device which is held by the main frame and which engages, when the head holding member is moved upward, relative to the main frame, to a special valve switching position, said at least one valve spool of an arbitrary one of the valve devices, and thereby switches the arbitrary valve device to the second state thereof in which the arbitrary valve device allows a corresponding one of the suction nozzles to communicate with the first positive-pressure supplying system.

The special valve switching device can switch only the valve spool of a valve device corresponding to, e.g., the suction nozzle that has failed to hold normally an electronic component, to the second state of the valve device in which the valve device allows the suction nozzle to communicate with the first positive-pressure supplying system. Consequently the positive pressure is supplied to the suction nozzle only, so that the suction nozzle can release or discard the electronic component that is held thereby in an inappropriate manner, e.g., in an inappropriate posture, or alternatively so that the suction nozzle can be cleaned by blowing off a foreign matter clogging the nozzle. In comparison with the special valve switching device in accordance with the present mode (32), the valve switching device or member in accordance with the above-described mode (8), (10), or (18) can be said as an ordinary, valve switching device or member. The special valve switching device and the ordinary valve switching device may be provided independent of each other. Alternatively, the special valve switching device and the ordinary valve switching device may share a common, valve switching member and/or a common, valve-switching-member operating device that operates the common valve switching member to carry out a valve switching operation, but may employ different control programs used to control the common valve-switching-member operating device in different manners. According to the present mode (32), the head holding member constitutes a portion of a valve-switching-member operating device of the special valve switching device, and the special valve switching device can switch, by utilizing the downward movement of the head holding member, only the valve spool of an arbitrary one of the valve devices.

(33) The apparatus according to the mode (32), wherein said at least one plural-nozzle head comprises at least one multiple-nozzle head which holds at least three said suction nozzles such that said at least three suction nozzles are located on a common circle and extend parallel to each other in a reference direction perpendicular to a plane containing the common circle, wherein the special valve switching device is held by the main frame such that the special valve switching member is revolveable about an axis line thereof extending perpendicularly to said plane and passing through a center of the common circle, and wherein the apparatus further comprises a special-valve-switching-device revolving device which revolves the special valve switching device to an arbitrary angular phase about the axis line thereof.

The special-resetting-member revolving device and the special-valve-switching-device revolving device may be provided independent of each other. Alternatively, a common revolving device may function as not only the special-resetting-member revolving device but also the special-valve-switching-device revolving device. In the latter case, the production cost of the present electronic-component holding apparatus can be reduced. The special resetting member may be formed integrally with a valve switching member (i.e., a "special" valve switching member) of the special valve switching device.

(34) The apparatus according to any of the modes (1) through (33), further comprising at least one single-nozzle head which holds a single suction nozzle, wherein the head holding portion of the head holding member selectively holds an arbitrary one of said at least one plural-nozzle head and said at least one single-nozzle head.

(35) The apparatus according to any of the modes (1) through (34), further comprising at least one dispenser head including a fluid accommodating portion which accommodates a viscous fluid, and an application nozzle which applies the viscous fluid, wherein the head holding portion of the head holding member selectively holds an arbitrary one of said at least one plural-nozzle head and the dispenser head.

For example, a single system may operate as not only an electronic-component mounting system but also a highly-viscous-fluid applying system. This single system can perform not only an operation of mounting electronic components on a circuit substrate but also an operation of applying a highly viscous fluid to a circuit substrate. Thus, the footprint and production cost of this system can be reduced. In some cases, this system can be used as the electronic-component mounting system only; and in other cases, the same system can be used as the highly-viscous-fluid applying system only.

(36) An electronic-component mounting system, comprising:
the electronic-component holding apparatus according to any of the modes (1) through (35);
a component supplying device which supplies a plurality of electronic components;
a substrate holding device which holds a circuit substrate on which the electronic components supplied by the component supplying device are mounted;
a moving device which moves at least one of the electronic-component holding apparatus, the component supplying device, and the substrate holding device relative to a different one of the electronic-component holding apparatus, the component supplying device, and the substrate holding device, along a plane perpendicular to each of respective axis lines of the suction nozzles; and
a control device which controls the moving device and the electronic-component holding apparatus so that the electronic-component holding apparatus receives the electronic components from the component supplying device, and mounts the electronic components on the circuit substrate held by the substrate holding device.

It is desirable that the electronic-component mounting system employ a plurality of sorts of plural-nozzle heads that hold suction nozzles at different pitches or intervals, respectively.

The present electronic-component mounting system can enjoy a reduced equipment cost and an increased component-mounting efficiency. For example, a production line may employ both a first sort of electronic-component mounting system including an electronic-component holding apparatus having a single-nozzle head, and a second sort of electronic-component mounting system including an electronic-component holding apparatus having a plural-nozzle head, for the purpose of mounting electronic components on two circuit substrates in such a manner that the first mounting system mounts components on one of the two substrates and concurrently the second mounting system mounts components on the other substrate. In this case, however, the plurality of sorts of mounting systems are needed, which leads to increasing an equipment cost of the production line. In contrast, the electronic-component mounting system in accordance with the present mode (36) can function as not only the above-indicated first sort of electronic-component mounting system but also the second sort of electronic-component mounting system, which leads to reducing the equipment cost of the production line. In addition, the two sorts of mounting systems may need different times to mount all the electronic components on the respective circuit substrates, because the sort(s) and/or total number of the components to be mounted on the one substrate may differ from those of the components to be mounted on the other substrate. That is, one of the two sorts of mounting systems has to wait frequently, without mounting any components, for the other mounting system to finish the mounting of the components, which leads to lowering a component-mounting efficiency of the production line. In contrast, the electronic-component mounting system in accordance with the present mode (36) can selectively hold and use an arbitrary one of the single-nozzle head and the plural-nozzle head, i.e., can perform an arbitrary one of a first sort of component mounting operation that prefers the use of the single-nozzle head and a second sort of component mounting operation that prefers the use of the plural-nozzle head. That is, the present electronic-component mounting system does not need any waiting times, which leads to increasing the component-mounting efficiency thereof.

(37) A method of mounting a plurality of electronic components on a single circuit substrate, comprising selectively holding, with a common head holding member, each one of (a) at least one plural-nozzle head which holds a plurality of suction nozzles such that the suction nozzles extend parallel to each other and hold respective electronic components, and (b) at least one single-nozzle head which holds a single suction nozzle holding an electronic component, by utilizing suction based on a negative pressure, and mounting, with the common head holding member, each one of (c) the electronic components held by said at least one plural-nozzle head and (d) the electronic component held by said at least one single-nozzle head, on the single circuit substrate.

It is desirable that the present electronic-component mounting method use a plurality of sorts of plural-nozzle heads that hold suction nozzles at different pitches or intervals, respectively. In this case, the common head holding member can selectively hold an appropriate one of the different sorts of plural-nozzle heads that corresponds to a size of electronic components to be held thereby. The present mounting method can enjoy the same advantages as those of the electronic-component mounting system in accordance with the above-described mode (36).

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF THE PREFERRED EMBODIMENTS

Hereinafter, preferred embodiments of the present invention will be described in detail by reference to the drawings.

Figure 1:
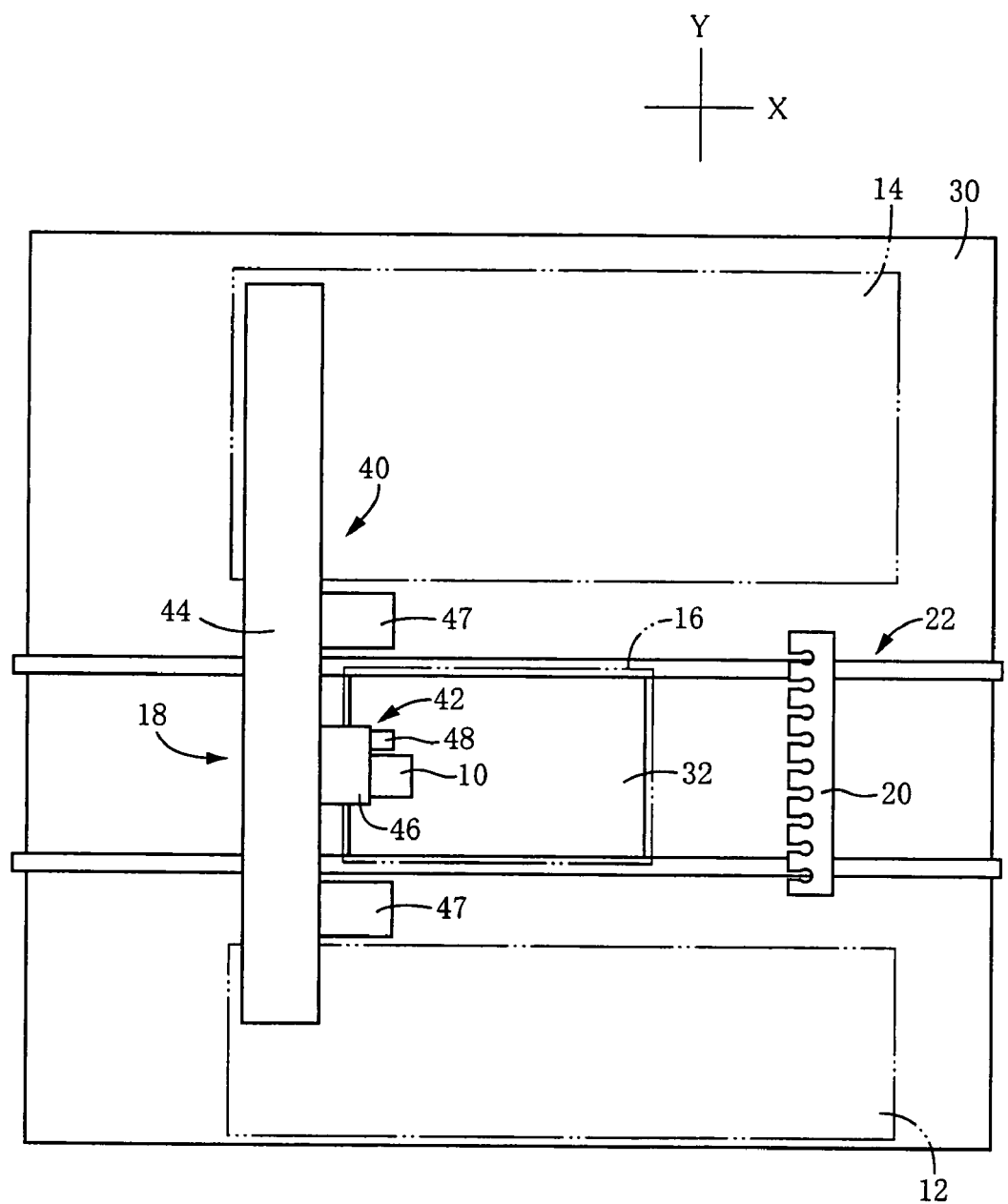
FIG. 1 is a plan view illustratively showing an electronic-component mounting system as an embodiment of the present invention.
Figure 20:
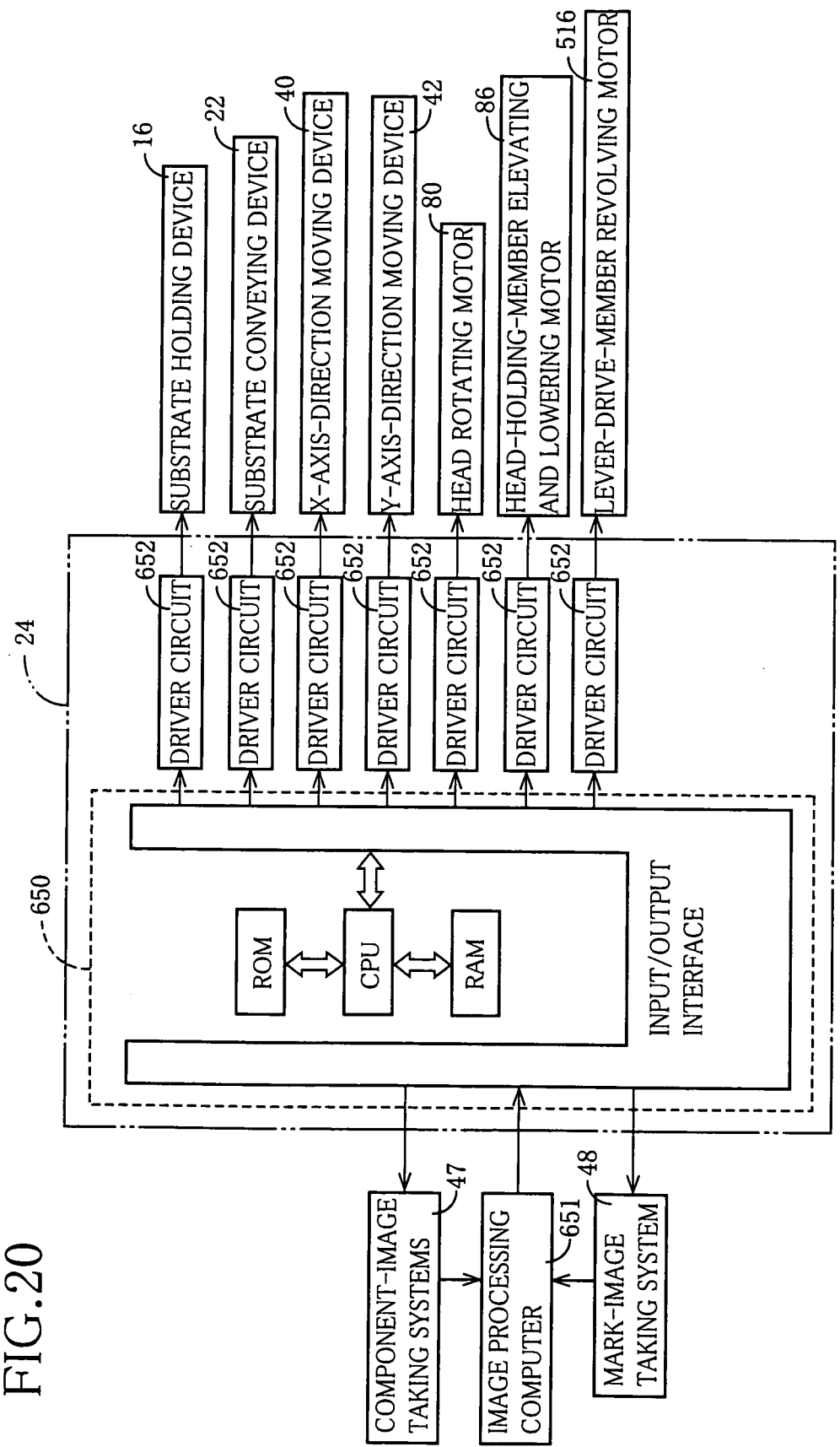
FIG. 20 is a diagrammatic view showing a control device that controls the electronic-component mounting system.

FIG. 1 shows an electronic-component mounting system to which the present invention is applied. The electronic-component mounting system includes an electronic-component holding apparatus 10; a feeder-type electronic-component supplying device 12 and a tray-type electronic-component supplying device 14 each as a sort of electronic-component supplying device; a circuit-substrate holding device 16; an electronic-component-holding-apparatus moving device 18; a head storage device 20; a circuit-substrate conveying device 22; and a control device 24 (FIG. 20).

The substrate conveying device 22 is provided on a bed 30 as a support member of the present mounting system, and includes, e.g., a belt conveyor that conveys a circuit substrate 32 in one horizontal direction so as to carry in, and out, the circuit substrate 32 to, and from, the substrate holding device 16. Hereinafter, the direction in which the circuit substrate 32 is conveyed will be referred to as an X-axis direction; and a direction perpendicular to the X-axis direction on a horizontal plane parallel to the circuit substrate 32 will be referred to as a Y-axis direction. The substrate holding device 16 is a stationary device including, e.g., a substrate supporting device, not shown, that supports a lower surface of the circuit substrate 32, carried in by the substrate conveying device 22; and a substrate clamping device, not shown, that clamps the circuit substrate 32 to the substrate supporting device and holds the circuit substrate 32 such that the substrate 32 takes a horizontal posture. In the present embodiment, as shown in FIG. 1, the feeder-type component supplying device 12 and the tray-type component supplying device 14 are also stationary devices that are provided, on the bed 30, on either side of the substrate conveying device 22, at respective positions distant from each other in the Y-axis direction.

In the present embodiment, the electronic-component-holding-apparatus moving device 18 includes an X-axis-direction moving device 40 and a Y-axis-direction moving device 42. The X-axis-direction moving device 40 includes, as a drive source thereof, a servomotor with an encoder as a sort of electric motor, and an X-axis slide 44 as a movable member that is movable in the X-axis direction. Likewise, the Y-axis-direction moving device 42 include, as a drive source thereof, a servomotor with an encoder as a sort of electric motor, and a Y-axis slide 46 as a movable member that is movable in the Y-axis direction. The two moving devices 40, 42 cooperate with each other to move the electronic-component holding apparatus 10 to an arbitrary position on a horizontal plane. The X-axis slide 44 supports and carries two component-image taking systems 47; and the Y-axis slide 46 supports and carries a mark-image taking device 48.

Figure 2:
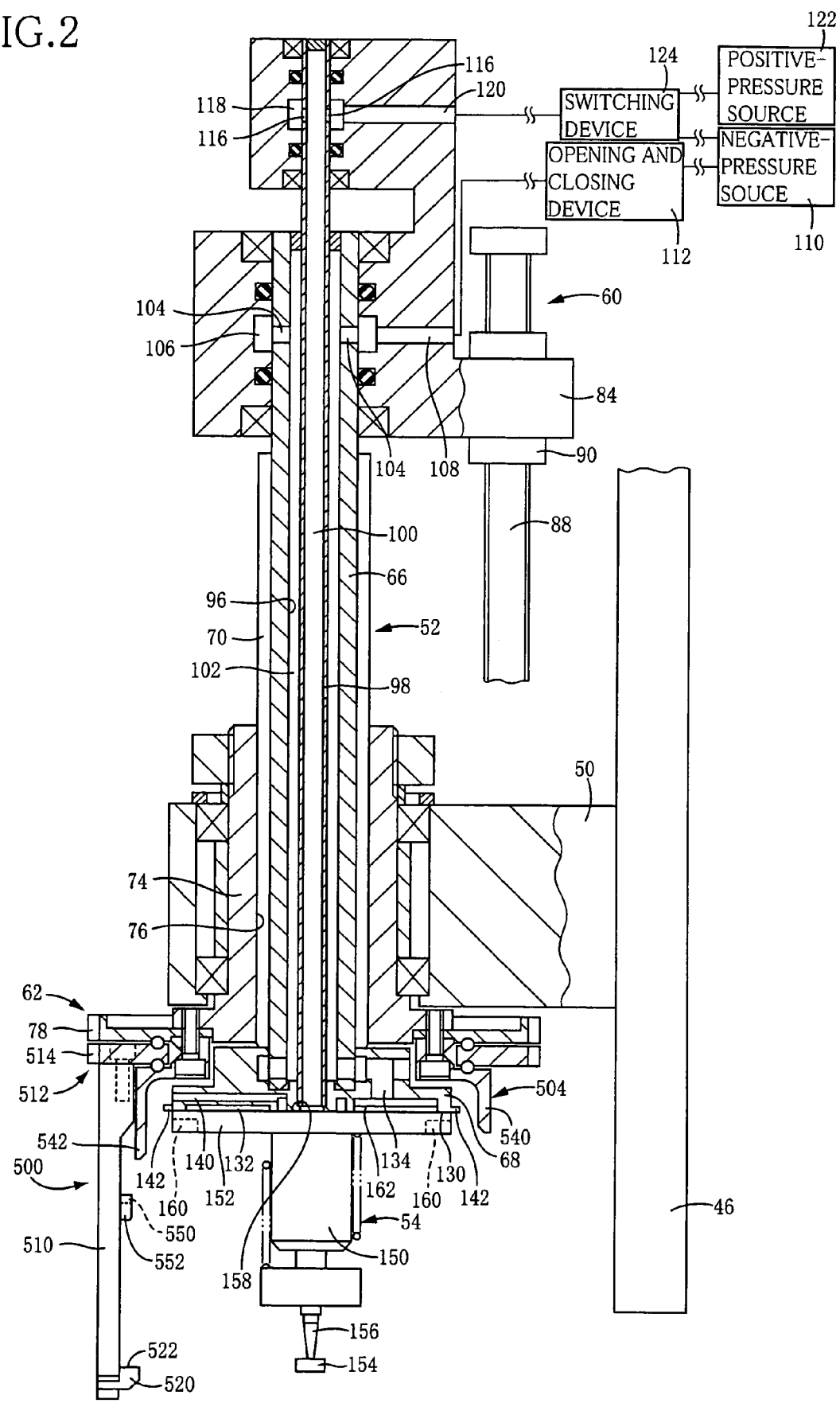
FIG. 2 is a partly cross-sectioned, front elevation view of an electronic-component holding apparatus that is employed by the electronic-component mounting system and that holds a single-nozzle head.
Figure 3:
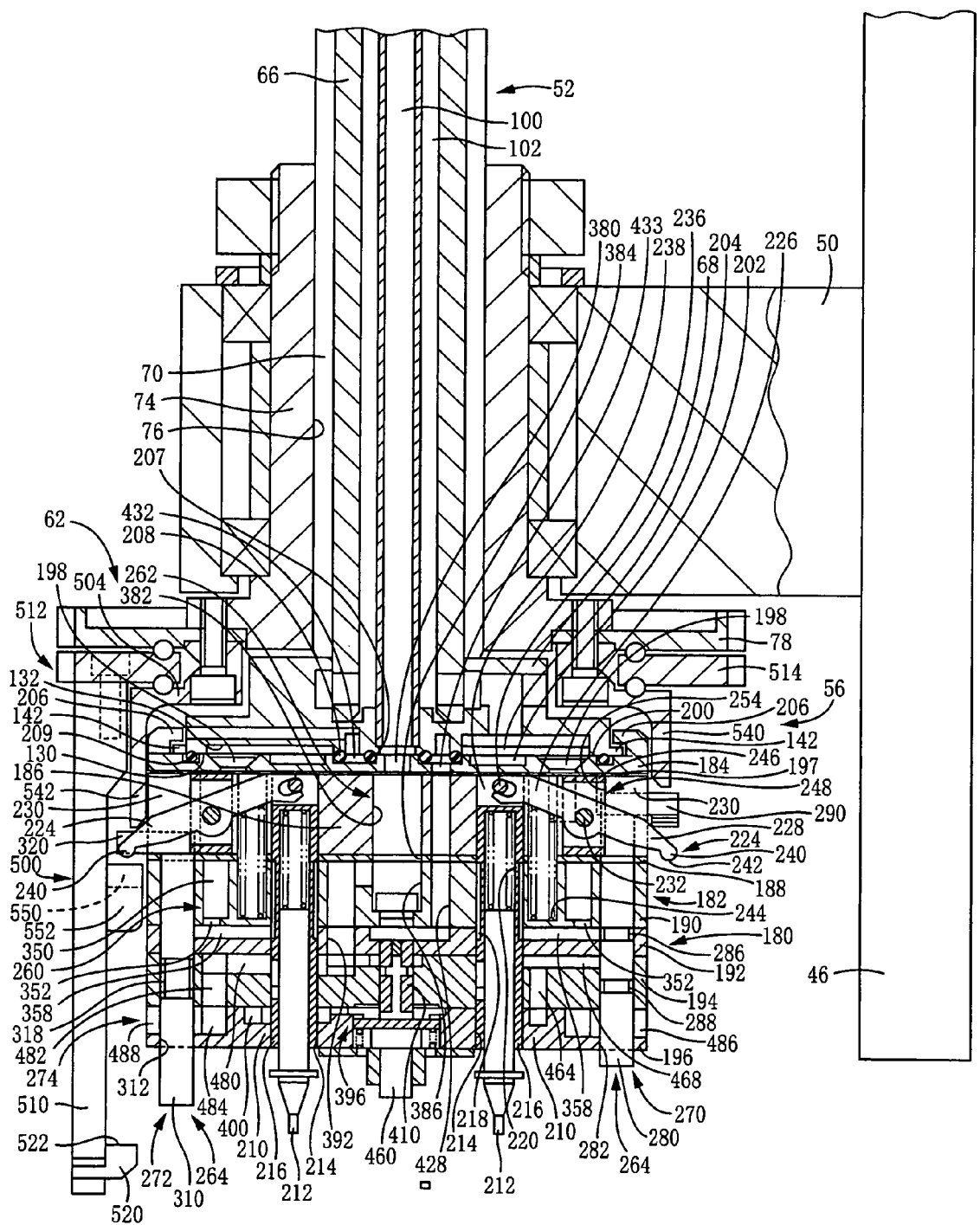
FIG. 3 is a partly cross-sectioned, front elevation view of the electronic-component holding apparatus that holds a revolver head in place of the single-nozzle head.

The electronic-component holding apparatus 10 includes a main frame 50; a head holding member 52; a plurality of single-nozzle heads 54 (one head 54 is shown in FIG. 2); a plurality of revolver heads 56 (one head 56 is shown in FIG. 3) each as a plural-nozzle head; a dispenser head 58 (FIG. 17); a head-holding-member elevating and lowering device 60; and a head rotating device 62. As shown in FIG. 2, the head holding member 52 includes an axis portion 66, and a nozzle holding portion 68 that is provided at a lower end of the axis portion 66 such that the nozzle holding portion 68 is coaxial with the axis portion 66. The axis portion 66 is a splined axis portion that has a circular transverse cross section, and a spline 70 formed on an outer circumferential surface thereof. The nozzle holding portion 68 has a circular transverse cross section, and a diameter larger than that of the axis portion 66.

The main frame 50 of the electronic-component holding apparatus 10 is integral with the Y-axis slide 46, and supports a rotatable body 74 as a rotatable member such that the rotatable body 74 is rotatable about a vertical axis line and is not movable in an axial direction thereof parallel to the vertical axis line. The rotatable body 74 has a cylindrical shape, and a spline 76 formed in an inner circumferential surface thereof. A gear 78 is detachably attached to a lower end portion of the rotatable body 74 that projects downward from the main frame 50. The gear 78 is rotated by a head rotating motor 80 (FIG. 20) as a drive source, so that the rotatable member 74 is rotated about its vertical axis line. The spline 70 of the axis portion 66 of the head holding member 52 fits in the spline 76 of the rotatable body 74, and accordingly the holding member 52 is movable relative to the rotatable body 74 in the axial direction thereof. Whichever position the head holding member 52 may take relative to the rotatable body 74 in the axial direction thereof, the holding member 52 can be rotated about the vertical axis line by an arbitrary angle in each of opposite directions by the head rotating motor 80. In the present embodiment, the head rotating device 62 includes the rotatable body 74, the gear 78, and the head rotating motor 80.

The head-holding-member elevating and lowering device 60 includes an elevator member 84 that is provided on the main frame 50 such that the elevator member 84 is movable upward and downward; a head-holding-member elevating and lowering motor 86 (FIG. 20) as a drive source; a ball screw 88 as a feed screw that is provided on the main frame 50 such that the ball screw 88 is not movable relative to the main frame 50 in an axial direction of the screw 88 and is rotatable about a vertical axis line; and a nut 90 fixed to the elevator member 84. An upper end portion of the axis portion 66 of the head holding member 52 is held by the elevator member 84 such that the axis portion 66 is rotatable relative to the elevator member 84 and is not movable relative to the same 84 in the axial direction of the axis portion 66. When the ball screw 88 is rotated by the head-holding-member elevating and lowering motor 86 and accordingly the elevator member 84 is moved upward and downward, the head holding member 52 is also moved upward and downward. Thus, the head-holding-member elevating and lowering device 60 constitutes a head-holding-member moving device.

The axis portion 66 has an inner hole 96 that is coaxial with the axis line of the axis portion 66 and has a circular cross section, and a cylindrical, passage-defining member 98 fits in the inner hole 96 such that the passage-defining member 98 is coaxial with the inner hole 96. Thus, the head holding member 52 has two inside passages, i.e., an inner passage 100 of the passage-defining member 98, and an annular passage 102 located between the passage defining member 98 and an inner circumferential surface of the axis portion 66 that defines the inner hole 96. The annular passage 102 is connected to a negative-pressure source 110 (e.g., negative-pressure pump) via radial passages 104 formed in the axis portion 66, and an annular passage 106 and a straight passage 108 each formed in the elevator member 84. An opening and closing device 112 allows, and inhibits, the supplying of negative pressure from the negative-pressure source 110 to the annular passage 102 of the head holding member 52. Hereinafter, the annular passage 102 will be referred to as the negative-pressure supply passage 102. In a modified form of the present embodiment, the annular passage 102 communicates with the atmosphere.

An upper end portion of the passage-defining member 98 is held by the elevator member 84 such that the passage-defining member 98 is rotatable relative to the elevator member 84 and is not movable relative to the same 84 in an axial direction of the member 98. The inner passage 100 of the passage-defining member 98 is connected to each of a positive-pressure source 122 (e.g., a compressor) and the above-described negative-pressure source 110 via radial passages 116 formed in the passage-defining member 98, and an annular passage 118 and a straight passage 120 each formed in the elevator member 84. A switching device 124 selectively allows the supplying of positive pressure, or the supplying of negative pressure, to the inner passage 100. In addition, the switching device 124 adjusts a magnitude of the positive pressure supplied to the inner passage 100. Hereinafter, the inner passage 100 will be referred to as the positive-pressure supply passage 100. In the present embodiment, the positive-pressure supply passage 100 constitutes a portion of a second positive-pressure supplying system.

The above-described, head holding portion 68 has a planar, suction surface 130 that extends perpendicularly to the axis line of the axis portion 66 (or the head holding member 52) and faces downward. The head holding portion 68 has an annular, negative-pressure-chamber defining recess 132 that is coaxial with the axis line of the head holding member 52 and communicates with the negative-pressure supply passage 102 via a connection passage 134. A lower end of the positive-pressure supply passage 100 opens in the suction surface 130. In addition, the head holding portion 68 has an atmosphere communication passage 140 that opens, at one end thereof, in the suction surface 130 and opens, at the other end thereof in an outer circumferential surface of the holding portion 68. Moreover, the head holding portion 68 has, at a lower end thereof, a plurality of (e.g., three) engaging projections 142 each as an engaging portion that project radially outward such that the three engaging projections 142 are equiangularly distant from each other about the axis line of the head holding member 52.

As shown in FIG. 2, each of the single-nozzle heads 54 includes a main portion 150, and a to-be-held portion 152 that is to be held by the head holding member 52 or the head holding portion 68 thereof. The main portion 150 includes a nozzle holding portion that holds a single suction nozzle 156, and the suction nozzle 156 holds, by suction, an electronic component 154. In the present embodiment, the to-be-held portion 152 has a disc-like shape having a circular transverse cross section, and a planar, to-be-sucked surface 158 that extends perpendicularly to an axis line of the to-be-held portion 152 and is to be sucked by the suction surface 130 of the head holding portion 68. In addition, the to-be-held portion 152 has two recesses 160 each as a positioning portion which are diametrically opposite to each other and each of which opens in both a lower surface, and an outer circumferential surface, of the portion 152. The to-be-sucked surface 158 of the single-nozzle head 54 is held, by suction, in gas-tight contact with the suction surface 130 of the head holding portion 68, such that the to-be-sucked surface 158 closes the negative-pressure-chamber defining recess 132 opening in the suction surface 130 and cooperates with the recess 132 to define a head-related negative-pressure chamber 162. That is, the negative pressure supplied from the negative-pressure supply passage 102 to the negative-pressure chamber 162 is applied to the single-nozzle head 54, so that the single-nozzle head 54 is held, by suction, by the head holding member 52. In the present embodiment, the negative-pressure supply passage 102 constitutes a head-related negative-pressure supply passage. Moreover, the positive-pressure supply passage 100 communicates with the main portion 150 of the single-nozzle head 54, so that the negative pressure or the positive pressure can be selectively supplied to the suction nozzle 156.

Next, each of the above-indicated revolver heads 56 will be described by reference to FIG. 3. In the present embodiment, a main body 180 of each revolver head 56 includes a laminated portion 182, and the laminated portion 182 includes a plurality of plate members, e.g., seven plate members 184, 186, 188, 190, 192, 194, 196 that are gas-tightly laminated on each other. The seven plate members 184 through 196 have a circular transverse cross section, and a same diameter. In particular, the second to seventh plate members 186 through 196 are positioned relative to each other in a direction perpendicular to an axis line of the laminated portion 182, by a plurality of positioning pins (not shown, each as a positioning member) that fit in respective through holes formed through respective thickness of the plate members 186 through 196 and extend in a direction parallel to the axis line. In this state, the plate members 186 through 196 are gas-tightly adhered and fixed to each other such that the plate members 186 through 196 cannot be separated from each other.

The first plate member 184 is detachably attached to the second plate member 186, by bolts 198 or other fixing members, such that a sealing member 197 in the form of a thin sheet is sandwiched by the two plate members 184, 186. Concerning the revolver head 56, the first plate member 184 constitutes a to-be-held portion, and a surface of the first plate member 184 that is opposite to the second plate member 186 constitutes a planar, to-be-held or to-be-sucked surface 200 that extends perpendicularly to an axis line of the main body 180. The first plate member 184 has an annular, negative-pressure-chamber defining recess 202 that opens in the to-be-sucked surface 200 and is coaxial with the axis line of the main body 180. When the revolver head 56 is held by the head holding member 52, the negative-pressure-chamber defining recess 202 of the first plate member 184 cooperates with the negative-pressure-chamber defining recess 132 of the head holding member 52 to define a head-related negative-pressure chamber 204. Leakage of the negative pressure or the positive pressure is prevented by not only the above-described seal member 197 but also three O-rings 207, 208, 209 each as a seal member. In addition, the first plate member 184 has, in an outer peripheral portion thereof, a plurality of (e.g., three) engaging projections 206 each as an engaging portion that are equiangularly distant from each other with respect to the axis line of the main body 180. Each of the engaging projections 206 first projects upward from the to-be-sucked surface 200 and then projects radially inward.

Figure 7:
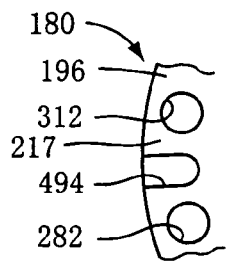
FIG. 7 is a bottom view showing a recess formed in the main body.

The main body 180 of the revolver head 56 has at least three (e.g., twelve) nozzle holding portions 210 that hold twelve suction nozzles 212, respectively. The twelve nozzle holding portions 210 have an identical construction. The twelve nozzle holding portions 210 may hold respective suction nozzles 212 of a same sort or of different sorts. Alternatively, some of the twelve nozzle holding portions 210 may hold respective suction nozzles 212 of a same, first sort and the other nozzle holding portions 210 may hold respective suction nozzles 212 of a same, second sort different from the first sort. In the case where the twelve nozzle holding portions 210 hold respective suction nozzles 212 of different sorts, respective suction pipes of the suction nozzles 212 may have different diameters, and the twelve nozzle holding portions 210 may hold the respective suction nozzles 212 in an arbitrary order of arrangement of the same 212. The twelve nozzle holding portions 210 have respective holding holes 214 that are formed through respective thickness of the second to seventh plate members 186 through 196, in a direction parallel to the axis line of the main body 180, and twelve nozzle holders 216 fit in the respective holding holes 214, such that each of the nozzle holders 216 is movable relative to a corresponding one of the holding holes 214 in an axial direction thereof. The twelve suction nozzles 212 fit in the respective nozzle holders 216, such that each of the suction nozzles 212 is movable relative to a corresponding one of the nozzle holders 216 in an axial direction thereof. The twelve holding holes 214 are provided on a common circle whose center rides on the axis line of the main body 180, such that only two holes 214 out of the twelve holes 214 are angularly distant from each other by more than 30 degrees and the other, ten holes 214 are equiangularly distant from each other by less than 30 degrees. A portion of the main body 180 that is located between the above-indicated two holding holes 214 that are angularly distant from each other by more than 30 degrees, will be referred to as an interference avoiding portion 217 (FIG. 7). Though each of the twelve suction nozzles 212 is associated with a first valve 270 and a second valve 272, the first valve 270 corresponding to one of the above-indicated two holding holes 214 and the second valve 272 corresponding to the other holding hole 214 are distant from each other by a larger distance than the other distances corresponding to the other pairs of adjacent holding holes 214, because the interference avoiding portion 217 is provided between the two valves 270, 272. The main body 180 holds the twelve suction nozzles 212 at respective positions on the above-described common circle, such that the suction nozzles 212 extend in a direction parallel to the axis line of the cylindrical main body 180. Hereinafter, the common circle on which the twelve suction nozzles 212 are held will be referred to as the nozzle holding circle. Meanwhile, each of the nozzle holders 216 has, in a cylindrical side wall thereof, an annular groove 218 that opens in an outer circumferential surface of the side wall and extends in an axial direction of the each holder 216; and a radial passage 220 through which the annular groove 218 communicates with an inner space of the each holder 216.

Figure 4:
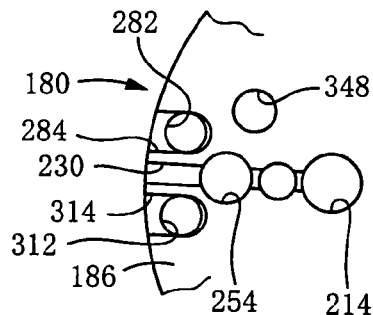
FIG. 4 is a plan view showing spool holes, etc formed in a main body of the revolver head.

An upper end of each of the twelve nozzle holders 216 is operatively connected to one 226 of two arms 226, 228 of a corresponding one of twelve pivotable levers 224, such that the each nozzle holder 216 is pivotable relative to the pivotable lever 224. Each of the twelve pivotable levers 224 has an elongate plate-like shape having the two arms 226, 228. As shown in FIGS. 3 and 4, each of the twelve pivotable levers 224 is accommodated by a corresponding one of twelve recesses 230 each as a lever accommodating portion that are formed in the second plate member 186, and is supported by the second plate member 186 such that the each lever 224 is pivotable about an axis member 232 that extends perpendicularly to the axis line of a corresponding one of the suction nozzles 212, at a position distant from the axis line of the corresponding nozzle 212. The two arms 226, 228 of each pivotable lever 224 extend from the axis member 232 in opposite directions, respectively, and have a same length. A free end of the first arm 226 of each pivotable lever 224 is operatively connected to a connection portion 236 provided in the upper end portion of a corresponding one of the nozzle holders 216, such that the first arm 226 is pivotable relative to the connection portion 236. In the present embodiment, the connection portion 236 of each nozzle holder 216 is constituted by a pin that has a circular cross section and is supported by a pair of side walls 238 (only one side wall 238 is shown in FIG. 3), provided in the upper end portion of the nozzle holder 216, such that the pin extends parallel to the axis member 232 of the pivotable lever 224. The second arm 238 of each pivotable lever 224 extends outward from the main body 180, and has, in a free end portion thereof a part-cylindrical, to-be-engaged portion 240 having a part-cylindrical, to-be-engaged surface 242 whose centerline is parallel to the axis member 232 of the pivotable lever 224.

A spring 244 as a biasing device that is provided between the first arm 226 of each pivotable lever 224 and the main body 180, biases the each lever 224 in a direction to move the corresponding nozzle holder 216 upward. A limit of the upward pivotal movement of each pivotable lever 224 that is caused by the biasing force of the corresponding spring 244, i.e., a limit of the upward movement of the corresponding nozzle holder 216 or the corresponding suction nozzle 212 is defined by butting contact of the nozzle holder 216 with the first plate member 184 closing respective upper openings of the holding holes 214. Hereinafter, a position of each pivotable lever 224 corresponding to the state in which the upward pivotal movement of the each lever 224, caused by the biasing force of the corresponding spring 244, is limited will be referred to as an initial position of the each lever 224 as a reference position thereof.

Figure 8:
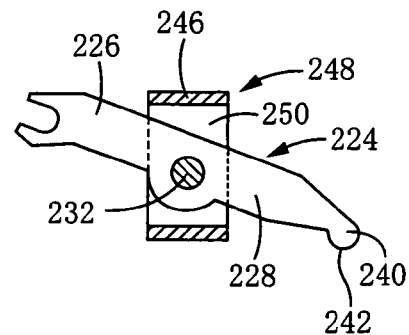
FIG. 8 is a cross-sectioned, front elevation view of a lever assembly of the revolver head.
Figure 9:
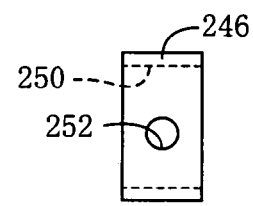
FIG. 9 is a front elevation view of a support member of the lever assembly.
Figure 10:
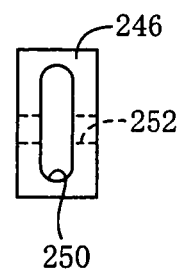
FIG. 10 is a side elevation view of the support member of the lever assembly.
Figure 11:
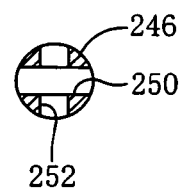
FIG. 11 is a cross-sectioned, plan view of the support member of the lever assembly.

Meanwhile, as shown in FIGS. 8, 9, and 10, each pivotable lever 224 is pivotably supported by a support frame 246, so as to provide a lever assembly 248 which in turn is assembled with the main body 180. The pivotable lever 224 is inserted into an elongate hole 250 of the support frame 246 and, in a state in which the two arms 226, 228 project outward from the support frame 246, the axis member 232 fits in the pivotable lever 224 via an insertion hole 252, so that the pivotable lever 224 is pivotably supported by the support frame 246. As shown in FIGS. 3 and 4, the second plate member 186 has twelve receiving holes 254 each of which has a circular cross section, is formed through the thickness of the plate member 186 in an axial direction thereof, and extends perpendicularly to the corresponding recess 230. Thus, the twelve receiving holes 254 provide twelve lever-assembly holding portions. Before the first plate member 184 is fixed to the second plate member 186, each of the lever assemblies 248 is held by a corresponding one of the receiving holes 254, such that the corresponding support frame 246 fits in the corresponding receiving hole 254 and respective end portions of the two arms 226, 228 that project outward from the support frame 246 are accommodated by the recess 230. Thus, each of the twelve pivotable levers 224 is pivotably held by the main body 180.

As shown in FIG. 3, the revolver head 56 has a first negative-pressure supplying system 260 that supplies a negative pressure to each of the twelve suction nozzles 212; a first positive-pressure supplying system 262 that supplies a positive pressure to the each suction nozzle 212; and twelve valve devices 264 that are associated with the twelve suction nozzles 212, respectively. Since the twelve valve devices 264 have an identical construction, one of the valve devices 264 will be described below as a representative thereof.

Figure 12:
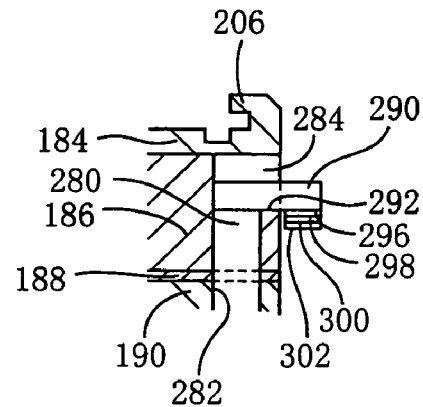
FIG. 12 is a cross-sectioned, front elevation view of an upper portion of a first valve spool of the revolver head.

The valve device 264 includes, in addition to the above-described first and second valves 270, 272, a spool-position maintaining device 274. The first valve 270 includes a first valve spool 280. As shown in FIG. 4, the main body 180 has a first spool hole 282 at a position on one side of each pivotable lever 224 in a circumferential direction of the main body 180, and on an outer side of the corresponding suction nozzle 212 in a radial direction of the main body 180. The first spool hole 282 is formed through respective thickness of the second to seventh plate members 186 through 196, in a direction parallel to the axis line of the main body 180, and an upper end of the first spool hole 282 communicates with an opening 284 that opens, as shown in FIG. 12, in an outer circumferential surface of the second plate member 186.

As shown in FIG. 3, the first valve spool 280 has two annular grooves 286, 288 that open in an outer circumferential surface thereof and are distant from each other in an axial or lengthwise direction thereof and a first, to-be-engaged portion 290 extending radially outward from an upper end portion thereof. The first valve spool 280 fits in the first spool hole 282 such that the first valve spool 280 is movable in an axial direction thereof, and is held by the first spool hole 282 such that the spool 280 is movable in a direction parallel to the respective axis lines of the twelve suction nozzles 212. Since the first to-be-engaged portion 290 fits in the opening 284, the first valve spool 280 is prevented from being rotated relative to the main body 180, and the to-be-engaged portion 290 projects radially outward from the main body 180. Here, it is noted that FIG. 3 basically shows a cross section of the revolver head 56, taken along a plane intersecting the two pivotable levers 224, but a portion of the cross section of FIG. 3 is taken along a plane intersecting the first and second valves 270, 272.

Figure 13:
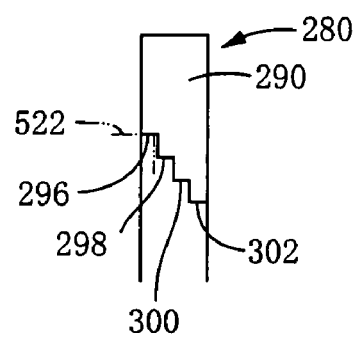
FIG. 13 is a side elevation view of a plurality of first to-be-engaged surfaces of the first valve spool.

In addition, since the first to-be-engaged portion 290 butts on an engaging surface (or a stopper surface) 292 (FIG. 12) defining a bottom surface of the opening 284, the first valve spool 280 is prevented from falling, because of its own weight, off the main body 180 and is thus positioned at an initial position thereof as a reference position thereof. In addition, as shown in FIGS. 12 and 13, the first to-be-engaged portion 290 has a plurality of (e.g., four) first, to-be-engaged surfaces 296, 298, 300, 302 that face downward and have respective stepwise different height positions in a direction parallel to an axis line of the first valve spool 280. In a state in which the pivotable lever 224 and the first valve spool 290 are held at their initial positions, the first to-be-engaged surfaces 296 through 302 are higher than the part-cylindrical to-be-engaged surface 242, as shown in FIG. 3.

Figure 14:
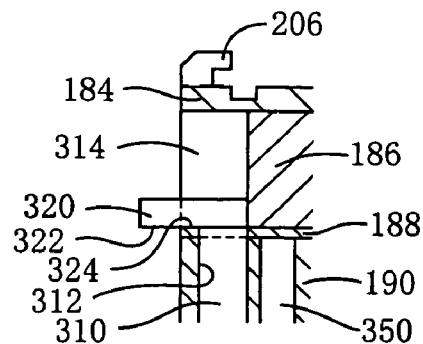
FIG. 14 is a cross-sectioned, front elevation view of an upper portion of a second valve spool of the revolver head.

The second valve 272 includes a second valve spool 310. As shown in FIG. 4, the second valve 272 additionally includes a second spool hole 312 that is formed, in the main body 180, at a position on an opposite side of each pivotable lever 224 that is opposite to the first spool hole 282, as seen in the circumferential direction of the main body 180, and on the outer side of the suction nozzle 212 as seen in the radial direction of the main body 180, such that the first and second spool holes 282, 312 are located on a common circle. As shown in FIG. 3, like the first spool hole 282, the second spool hole 312 is formed through respective thickness of the second to seventh plate members 186 through 196, in the direction parallel to the axis line of the main body 180 and, as shown in FIG. 14, an upper end of the second spool hole 312 communicates with an opening 314 that opens in the outer circumferential surface of the second plate member 186. Thus, the second valve spool 310 fits in the second spool hole 312 such that the spool 310 is movable relative to the hole 312 in an axial direction thereof.

The second valve spool 310 has an annular groove 318 (FIG. 3) that opens in an outer circumferential surface thereof, and a second, to-be-engaged portion 320 that extends radially outward from an upper end portion thereof and fits in the opening 314. Thus, the second valve spool 310 is prevented from being rotated relative to the main body 180. A free end portion of the second to-be-engaged portion 320 projects outward from the main body 180, and a lower surface of the to-be-engaged portion 320 constitutes a second, to-be-engaged surface 322 (FIG. 14). In addition, since the second to-be-engaged portion 320 butts on an engaging surface (or a stopper surface) 324 defining a bottom surface of the opening 314, the second valve spool 310 is prevented from falling off the main body 180, and is thus positioned at an initial position thereof as a reference position thereof. In a state in which the pivotable lever 224 and the second valve spool 310 are held at their initial positions, the second to-be-engaged portion 320 is lower than the first to-be-engaged surfaces 296 through 302 and is somewhat higher than the to-be-engaged surface 242 of the pivotable lever 224, as shown in FIG. 3. The pivotable lever 224 and the first and second valve spools 280, 310 are arranged along the above-indicated, nozzle holding circle, and the to-be-engaged portions 240, 290, 320 are located on a common circle that is concentric with the nozzle holding circle.

Next, the first negative-pressure supplying system 260 will be described. The first negative-pressure supplying system 260 includes a through passage (not shown) that is formed through the thickness of the first plate member 184 and opens in the to-be-sucked surface 200; a through passage 348 (FIG. 4) that is formed through the respective thickness of the second and third plate members 186, 188 and communicates with the through passage of the first plate member 184; and an annular groove 350 (FIG. 3) that is formed in the fourth plate member 190. The annular groove 350 is formed in an upper surface of the fourth plate member 190 that is fixed to a lower surface of the third plate member 188, such that the annular groove 350 runs along a circle concentric with the nozzle holding circle and communicates via the through passage 348 with the through passage of the first plate member 184.

Figure 5:
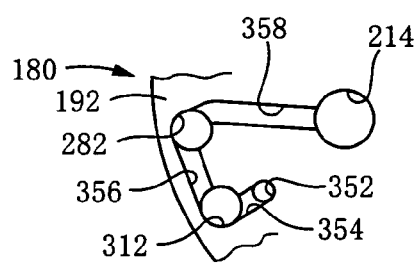
FIG. 5 is a plan view showing negative-pressure-supply individual passages formed in the main body.

As shown in FIG. 3, the fourth plate member 190 has, for each of the twelve valve devices 264, a through passage 352 that communicates with the annular groove 350; and as shown in FIG. 5, the fifth plate member 192 has, for each of the twelve valve devices 264, a radial-direction groove 354 that is formed in an upper surface of the fifth member 192 so as to extend in a substantially radial direction of the nozzle holding circle and connect between a corresponding one of the twelve through passages 352 and a corresponding one of the twelve second spool holes 312. For each of the twelve valve devices 264, the fifth plate member 192 additionally has, in the upper surface thereof, a circumferential-direction groove 356 that runs in a circumferential direction of the nozzle holding circle so as to connect between a corresponding one of the second spool holes 312 and a corresponding one of the first spool holes 282; and a radial-direction groove 358 that runs in a radial direction of the nozzle holding circle so as to connect between a corresponding one of the first spool holes 282 and a corresponding one of the holding holes 214 and communicate with the annular groove 218 of a corresponding one of the nozzle holders 216.

As shown in FIG. 3, in the state in which the first valve spool 280 is held at its initial position, the annular groove 286 of the first spool 280 is aligned with both the radial-direction groove 358 and the circumferential-direction groove 356, so that the radial-direction groove 358 and the circumferential-direction groove 356 communicate with each other. In the state in which the second valve spool 310 is held at its initial position, the annular groove 318 of the second spool 310 is not aligned with either the radial-direction groove 354 or the circumferential-direction groove 356, i.e., is held at a lower position, so that the radial-direction groove 354 and the circumferential-direction groove 356 do not communicate with each other. Thus, normally or basically, the first valve 270 takes a negative-pressure supply state; and the second valve 272 does not take a negative-pressure supply state, i.e., takes a non-supply state in which the second valve 272 disconnects the first valve 270 from the first negative-pressure supplying system 260. Meanwhile, if the second valve spool 310 is moved upward from its initial position relative to the main body 180, and the annular groove 318 is aligned with both the radial-direction groove 354 and the circumferential-direction groove 356, the second valve 272 takes the negative-pressure supply state, and allows the first valve 270 to communicate with the first negative-pressure supplying system 260. Consequently, the negative pressure is supplied to the suction nozzle 212 via the annular groove 286, the radial-direction groove 358, the annular groove 218, and the radial passages 220. The negative-pressure supply state of the first valve spool 280 corresponds to the initial position thereof. In the present embodiment, the main body 180 includes twelve valve-device supporting portions each of which supports a corresponding one of the twelve valve devices 264 and defines a corresponding one of the first spool holes 282 and a corresponding one of the second spool holes 312; and the twelve through passages 352, the twelve radial-direction grooves 354, the twelve circumferential-direction grooves 356, and the twelve radial-direction grooves 358 cooperate with each other to constitute twelve individual passages of the first negative-pressure supplying system 260 where the twelve first valves 270 and the twelve second valves 272 are provided, respectively.

Next, the first positive-pressure supplying system 262 will be described. As shown in FIGS. 3 and 5, the first positive-pressure supplying system 262 includes a through hole 380 that is formed through the thickness of the first plate member 184, along an axis line thereof; a through hole 382 that is formed through the thickness of the second plate member 186, along an axis line thereof; a through hole 384 that is formed through the thickness of the third plate member 188, along an axis line thereof; a bottomed passage 386 that is formed through the thickness of the fourth plate member 190, along an axis line thereof; a radial-direction groove 388 that is formed in an upper surface of the fourth plate member 190 so as to extend in a substantially radial direction of the nozzle holding circle; a through passage 390 that is formed through the thickness of the fourth plate member 190; a through passage 392 that is formed through the thickness of the fifth plate member 192; a radial-direction groove 394, an annular groove 395, and a pressure reducing valve 396 that are formed in the upper surface of the sixth plate member 194; and a radial-direction groove 398 and an annular groove 400 that are formed in an upper surface of the seventh plate member 196.

In the present embodiment, as shown in FIG. 3, the pressure reducing valve 396 include a pressure reducing piston 410 having a stepped shape; and a cylindrical bore 412 that has a stepped shape and is formed in the main body 180 such that the cylindrical bore 412 is coaxial with the main body 180. The pressure reducing valve 396 gas-tightly fits in the cylindrical bore 412, such that the pressure reducing valve 396 is movable in an axial direction thereof. Consequently a first atmospheric-pressure chamber 424 is defined by an upper end of the pressure reducing piston 410, and communicates with the atmosphere via a radial-direction passage 426 formed in the fifth plate member 184, respective through passages 428, 430, 431, 433 (FIGS. 3 and 15) formed in the fourth, third, second, and first plate members 190, 188, 186, 184, and an annular groove 432 formed in the first plate member 184. In addition, a pressure reducing chamber 440 is defined by, and between, a stepped shoulder 434 of the cylindrical bore 412 and a large-diameter portion 436 of the piston 410, and communicates with the radial-direction groove 398. Though an inner portion of the radial-direction groove 398 that is near to the pressure reducing chamber 440 is given in the form of an annular groove, it is not essentially required to form the annular groove. In addition, a second atmospheric-pressure chamber 442 is defined by a lower end of the large-diameter piston 436, and communicates with the atmosphere. A spring 444 as an elastic member as a sort of biasing device is provided in the second atmospheric-pressure chamber 442, such that the spring 444 biases the pressure reducing piston 410 in a direction to reduce a volume of the pressure reducing chamber 440.

Figure 15:
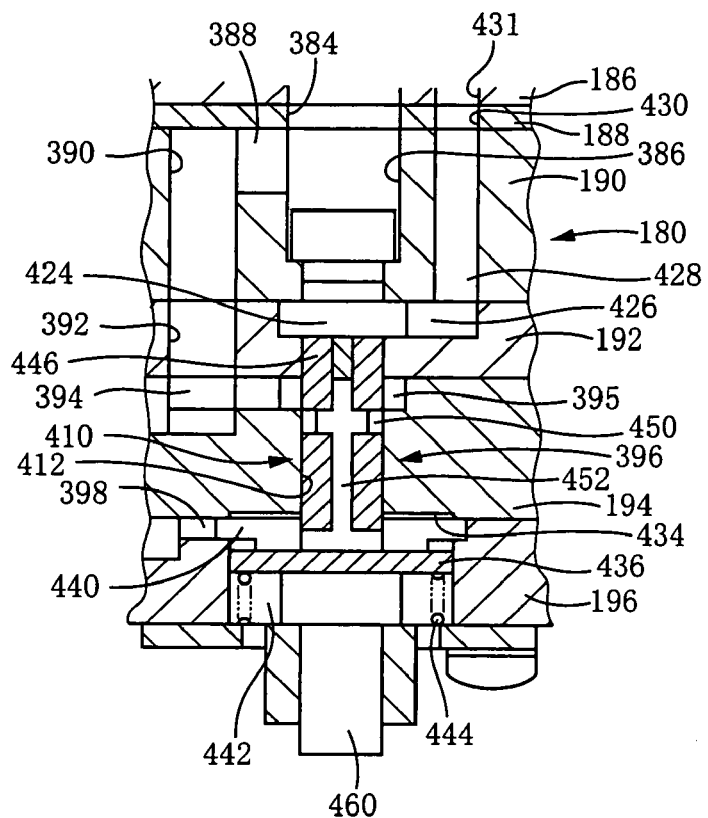
FIG. 15 is a cross-sectioned, front elevation view of a pressure reducing valve of the revolver head.

As shown in FIG. 15, the pressure reducing piston 410 additionally includes a small-diameter portion 446 that has an annular groove 450 opening in an outer circumferential surface thereof; and an inner passage 452 through which the annular groove 450 communicates with the pressure reducing chamber 440. In a state in which the annular groove 450 communicates with the annular groove 395 of the sixth plate member 194, the positive pressure is supplied to the pressure reducing chamber 440, so that a force corresponding to the positive pressure, and a biasing force of the spring 444 are exerted in opposite directions, respectively, to the pressure reducing piston 410. When the force corresponding to the positive pressure, and the biasing force of the spring 444 are balanced with each other, the two annular grooves 395, 450 are disconnected from each other. Thus, the positive pressure is adjusted or reduced to a value corresponding to a pre-set load of the spring 444. In the present embodiment, the positive pressure is reduced down to a value suitable for vacuum brake. When the pressure in the pressure reducing chamber 440 is reduced, the pressure reducing piston 410 is moved by the biasing force of the spring 444, so that the two annular grooves 395, 450 communicate with each other. Thus, in an operative state of the pressure reducing valve 396, the pressure reducing piston 410 is movable in the axial direction thereof so as to reduce the positive pressure.

The main body 180 is provided with a pressure-reduction canceling member 460. In the present embodiment, the pressure-reduction canceling member 460 has a pin-like shape having a circular cross section, and is provided in the second atmospheric-pressure chamber 442 such that the canceling member 460 is coaxial with the pressure reducing piston 410 and is movable in an axial direction of the canceling member 460. In a state in which the pressure-reduction canceling member 460 is positioned at a pressure-reduction allowing position, shown in FIG. 15, the canceling member 460 allows the pressure reducing piston 410 to be moved against the biasing force of the spring 444 and thereby allows the pressure reducing valve 396 to reduce the positive pressure. On the other hand, in a state in which the pressure-reduction canceling member 460 is positioned at a pressure-reduction canceling position, the canceling member 460 keeps the pressure reducing piston 410 at a position where the large-diameter portion 436 thereof is held in butting contact with the stepped shoulder 434. Thus, the two annular grooves 395, 450 are allowed to communicate with each other, and the positive pressure is not reduced. That is, the pressure reducing valve 396 is placed in an inoperative state thereof. In this state, however, the pressure reducing chamber 440 is kept in communication with the radial-direction groove 398.

Figure 6:
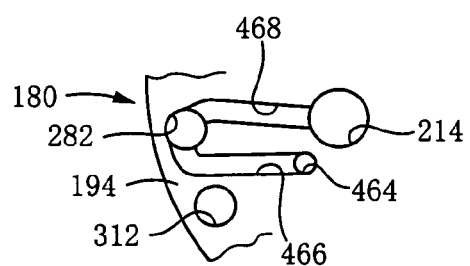
FIG. 6 is a plan view showing positive-pressure-supply individual passages formed in the main body.

As shown in FIGS. 3 and 6, the sixth plate member 194 has, for each of the twelve valve devices 264, a through passage 464 that communicates with the annular groove 400 of the seventh plate member 196. In addition, the sixth plate member 194 has, in an upper surface thereof, a radial-direction groove 466 connecting between the through passage 464 and a corresponding one of the twelve first spool holes 282; and another radial-direction groove 468 connecting between the one first spool hole 282 and a corresponding one of the twelve holding holes 214. In the state in which the first valve spool 280 is kept at its initial position, shown in FIG. 3, the annular groove 288 is lower than the radial-direction grooves 466, 468, so that the suction nozzle 212 does not communicate with the first positive-pressure supplying system 262. Meanwhile, if the first valve spool 280 is moved upward relative to the main body 180, and accordingly the annular groove 288 is aligned with the radial-direction grooves 466, 468, that is, if the first valve spool 280 takes a positive-pressure supply position, then the suction nozzle 212 is allowed to communicate with the first positive-pressure supplying system 262. In the present embodiment, the twelve through passages 464, the twelve radial-direction grooves 466, and the twelve radial-direction grooves 466 cooperate with each other to constitute twelve individual passages of the first positive-pressure supplying system 262 in which the twelve first valves 270 are provided, respectively. The present revolver head 56 is designed such that in the state in which each of the twelve first valve spools 280 is kept at its positive-pressure supply position, an entirety of the each first valve spool 280 is completely retracted into the main body 180 and a lower end surface of the first spool 280 is aligned with a lower surface of the main body 180, and such that in the state in which each of the twelve second valve spools 310 is held at its negative-pressure supply position, an entirety of the each second valve spool 310 is completely retracted into the main body 180 and a lower end surface of the second spool 310 is aligned with the lower surface of the main body 180.

In addition, the positive pressure is applied to each of the twelve first valve spools 280 and the twelve second valve spools 310, so as to keep a current position of the each valve spool 280, 310 in an axial direction thereof. More specifically described, as shown in FIG. 3, the sixth plate member 194 has, in the upper surface thereof, a radial-direction groove 480 that communicates with the through passage 392 of the fifth plate member 192, and additionally has a through passage 482 formed through the thickness of the sixth plate member 194; and the seventh plate member 196 has, in the upper surface thereof an annular groove 484, and a radial-direction groove 486 that communicates with the annular groove 484, perpendicularly intersects a corresponding one of the twelve first spool holes 282, and opens in the outer circumferential surface of the seventh plate member 196. The seventh plate member 196 additionally has, in the upper surface thereof, a radial-direction groove 488 that communicates with the annular groove 484, perpendicularly intersects a corresponding one of the twelve second spool holes 312, and opens in the outer circumferential surface of the seventh plate member 196. Since the positive pressure is supplied, without being reduced, to the radial-direction grooves 486, 488, the positive pressure is applied to the first and second valve spools 280, 310 in a radially outward direction from the centerline (i.e., axis line) of the main body 180. Since the first and second valve spools 280, 310 are pressed against respective inner circumferential surfaces of the first and second spool holes 282, 312, the axial-direction position of each of the first and second valve spools 280, 310 is maintained because of a frictional force produced by the each valve spool 280, 310 and the inner surface of a corresponding one of the spool holes 282, 312. In the present embodiment, a portion of each of the radial-direction grooves 486, 488 that is located nearer to the annular groove 484 than a corresponding one of the first and second spool holes 282, 312, constitutes an asymmetric pressure chamber that constitutes a portion of the spool-position maintaining device 274.

As shown in FIG. 7, the main body 180 has, in the interference avoiding portion 217, a recess 494 that opens in the lower surface of the main body 180, opposite to the to-be-sucked surface 200, and additionally opens in the outer circumferential surface of the main body 180. The recess 494 constitutes a positioning portion of the main body 180.

The main frame 50 supports a nozzle elevating and lowering device 500 as a nozzle moving device; and a resetting ring 504 as an ordinary resetting member. As shown in FIG. 3, the nozzle elevating and lowering device 500 includes a lever drive member 510, and is revolved by a nozzle-elevating-and-lowering-device revolving device 512 to an arbitrary angular phase about the center of the nozzle holding circle. The nozzle-elevating-and-lowering-device revolving device 512 includes a gear 514 that is supported by the above-described gear 78, and the resetting ring 504 fixed to the rotatable body 74, such that the gear 514 is not movable in an axial direction thereof and is rotatable about the center of the nozzle holding circle. The lever drive member 510 is detachably attached to the gear 514. Therefore, when the gear 514 is rotated by a lever-drive-member revolving motor 516 (FIG. 20), the lever drive member 510 is revolved to an arbitrary angular phase relative to the axis line of the revolver head 56.

The lever drive member 510 has an elongate shape, and projects downward from an outer peripheral portion of the gear 514 that is offset outward from the revolver head 56 in a radial direction of the gear 514. The lever drive member 510 has, in a lower end portion thereof, a drive portion (or an engaging portion) 520 projecting inward toward the revolver head 56. The engaging portion 520 has an engaging surface 522 that extends perpendicularly to the respective axis lines of the suction nozzles 212 and faces upward. The engaging portion 520 is located, as seen in a radial direction of the main body 180, outside of a locus of upward and downward movements of the main body 180 and inside of a locus of upward and downward movements of the to-be-engaged portion 240 of the second arm 228 of each of the pivotable levers 224. Therefore, when the head holding member 52 is moved downward and accordingly the revolver head 56, held by the holding member 52, is moved downward, the engaging surface 522 engages the to-be-engaged portion 240 of one of the pivotable levers 224 so as to inhibit the downward movement of the to-be-engaged portion 240. When the revolver head 56 is further moved downward and accordingly the axis line about which the one pivotable lever 224 is pivotable is moved downward relative to the to-be-engaged portion 240, the one pivotable lever 224 is pivoted, so that the engaging portion of the first arm 226 of the one pivotable lever 224 that is connected to the corresponding nozzle holder 216 is moved downward and accordingly the corresponding suction nozzle 212 is moved downward. In the present embodiment, since the two arms 226, 228 of each pivotable lever 224 have a same length, the suction nozzle 212 is moved downward by twice a distance by which the revolver head 56 is moved downward.

The part-cylindrical to-be-engaged portion 240 of each pivotable lever 224, the first to-be-engaged portion 290 of each first valve spool 280, and the second to-be-engaged portion 320 of each second valve spool 310 are located on a common circle. Therefore, the engaging portion 520 (or the engaging surface 522) of the lever drive member 510 can additionally engage the first to-be-engaged portion 290 of each first valve spool 280, or the second to-be-engaged portion 320 of each second valve spool 310. The engaging surface 522 has, as seen in a revolving direction of the lever drive member 510, a width assuring that the engaging surface 522 can simultaneously engage both the part-cylindrical to-be-engaged portion 240 and the first to-be-engaged portion 290, or simultaneously engages both the part-cylindrical to-be-engaged portion 240 and the second to-be-engaged portion 320. More specifically described, when the lever drive member 510 is positioned, as seen in the revolving direction thereof, at a first switching position where the engaging portion 520 can simultaneously engage, with respect to each suction nozzle 212 and the corresponding valve device 264, both the part-cylindrical to-be-engaged portion 240 and the first to-be-engaged portion 290, the engaging portion 520 additionally engages, when the head holding member 52 is moved downward, the first to-be-engaged portion 290, and thereby inhibits the downward movement of the first valve spool 290, so that the first valve spool 290 is moved upward, relative to the main body 180, from its initial position to its positive-pressure supply position. In addition, when the lever drive member 510 is positioned, as seen in the revolving direction thereof, at a second switching position where the engaging portion 520 can simultaneously engage, with respect to each suction nozzle 212 and the corresponding valve device 264, both the part-cylindrical to-be-engaged portion 240 and the second to-be-engaged portion 320, the engaging portion 520 additionally engages, when the head holding member 52 is moved downward, the second to-be-engaged portion 320, and thereby inhibits the downward movement of the second valve spool 310, so that the second valve spool 310 is moved upward, relative to the main body 180, from its initial position to its negative-pressure supply position. In the present embodiment, the lever drive member 510 also functions as an ordinary valve-switching member; the nozzle elevating and lowering device 500 also functions as an ordinary valve-switching device; and the nozzle-elevating-and-lowering-device revolving device 512 also functions as an ordinary-valve-switching-device revolving device.

Figure 16:
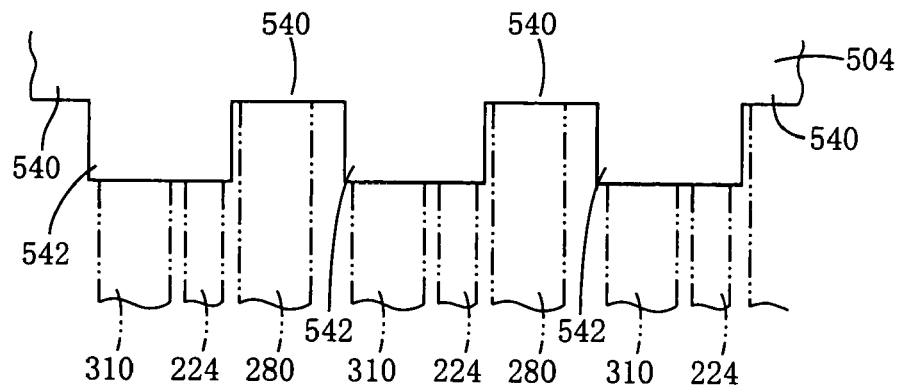
FIG. 16 is a development elevation view of a resetting ring of the electronic-component holding apparatus.

In the present embodiment, the above-described resetting ring 504 has a cylindrical shape having a circular transverse cross section, and is detachably attached to the rotatable body 74 such that the resetting ring 504 is coaxial with the rotatable body 74. Thus, the resetting ring 504 is rotated as if it were an integral portion of the rotatable body 74. As shown in FIG. 3, the resetting ring 504 is located inside of a locus of revolving of the lever drive member 510, and does not interfere with the main body 180. However, the resetting ring 510 has a diameter reaching the locus of upward and downward movements of each of the to-be-engaged portion 240 of each pivotable lever 224, the to-be-engaged portion 290 of each first spool valve 290, and the to-be-engaged portion 320 of each second spool valve 310. The resetting ring 510 has, in a lower end portion thereof, twelve first ordinary resetting portions 540 and twelve second ordinary resetting portions 542 that correspond to the twelve valve devices 264, respectively, as shown in FIG. 16. Each first ordinary resetting portion 540 and each second ordinary resetting portion 542 have different height positions, i.e., different positions as seen in a direction parallel to the respective axis lines of each first valve spool 280 and each second valve spool 310. A difference of the different height positions is equal to a difference of respective height positions of respective upper surfaces of each first valve spool 280 and each second valve spool 310 being positioned at their initial positions. Therefore, when the head holding member 52 and the revolver head 56 are moved upward in the state in which the first valve spools 280 and the second valve spools 310 are positioned at their positive-pressure supply positions and their negative-pressure supply positions, respectively, the first ordinary resetting portions 540 and the second ordinary resetting portions 542 engage the first to-be-engaged portions 290 and the second to-be-engaged portions 320, respectively, so as to inhibit respective further upward movements of the first and second portions 290, 320. Thus, the first and second valve spools 280, 310 are moved downward relative to the main body 180, so as to be returned to their initial positions. The first and second ordinary resetting portions 540, 542 are so formed as to return the first and second valve spools 280, 310 to their initial positions, when the head holding member 52 is positioned at an upward-movement end position thereof. The upward-movement end position of the head holding member 52 is an ordinary resetting position thereof to which the head holding member 52 is moved upward by the head-holding-member elevating and lowering device 60. Each second ordinary resetting portion 542 additionally engages the to-be-engaged portion 240 of the second arm 228 of the corresponding pivotable lever 224, and thereby resets the pivotable lever 224 to its initial position. Though each pivotable lever 224 is moved upward, i.e., toward its initial position by the biasing force of the corresponding spring 244, the returning of the each pivotable lever 224 is assured by the corresponding second ordinary resetting portion 542, even if the biasing force may not sufficiently great.

In fact, the resetting ring 504 returns the pivotable levers 224 and the first and second valve spools 280, 310 to their initial positions that are, however, somewhat short of their initial positions defined by the first plate member 184 and the stopper surfaces 292, 324 (FIGS. 12 and 14). That is, when the resetting ring 504 returns the levers 224 and the spools 280, 310 to their initial positions, there are left small gaps between (a) the first arms 226 and the first and second to-be-engaged portions 290, 320, and (b) the first plate member 184 and the stopper surfaces 292, 324 (FIGS. 12 and 14), respectively, so as to prevent damaging or breaking of the levers 224 and the spools 280, 310. However, the initial positions established by the resetting ring 504 do not substantially differ from the initial positions defined by the plate member 184 and the stopper surfaces 292, 324.

As shown in FIG. 3, the lever drive member 510 includes a first special resetting portion 550 and a second special resetting portion 552 that are located, as seen in a radial direction of the head holding member 52, at the same position as the position where the first and second ordinary resetting portions 540, 542 are located, and that have the same height-position difference as that of the first and second ordinary resetting portions 540, 542. The first special resetting portion 550 is so formed as to be able to engage the first to-be-engaged portion 290 of each one of the first valve spools 280, and thereby return the one first valve spool 280 to its initial position; and the second special resetting portion 552 is so formed as to be able to engage the second to-be-engaged portion 320 of each one of the second valve spools 310 and the to-be-engaged portion 240 of a corresponding one of the pivotable levers 224, and thereby return the one second valve spool 310 and the one pivotable lever 224 to their initial positions. The first and second special resetting portions 550, 552 are formed, as seen in a lengthwise direction of the lever drive member 510 (i.e., a vertical direction), at respective positions assuring that the first and second special resetting portions 550, 552 can return the one first valve spool 280, the one second valve spool 310, and the one pivotable lever 224 to their initial positions, by moving those elements 280, 310, 224 relative to the main body 180 without causing the other second valve spools 310, positioned at their negative-pressure supply positions, to engage the second ordinary resetting portions 542. A height position to which the head holding member 52 is moved upward to cause the first and second special resetting portions 550, 552 to return the first and second valve spools 280, 310 to their initial positions, will be referred to as the special resetting position of the head holding member 52. The special resetting position of the head holding member 52 is lower than the ordinary resetting position thereof. In the present embodiment, the first and second special resetting portions 550, 552 cooperate with each other to constitute a special resetting member that is integral with the lever drive member 510; and the nozzle-elevating-and-lowering-device revolving device 512 also functions as a special-resetting-member revolving device.

Figure 17:
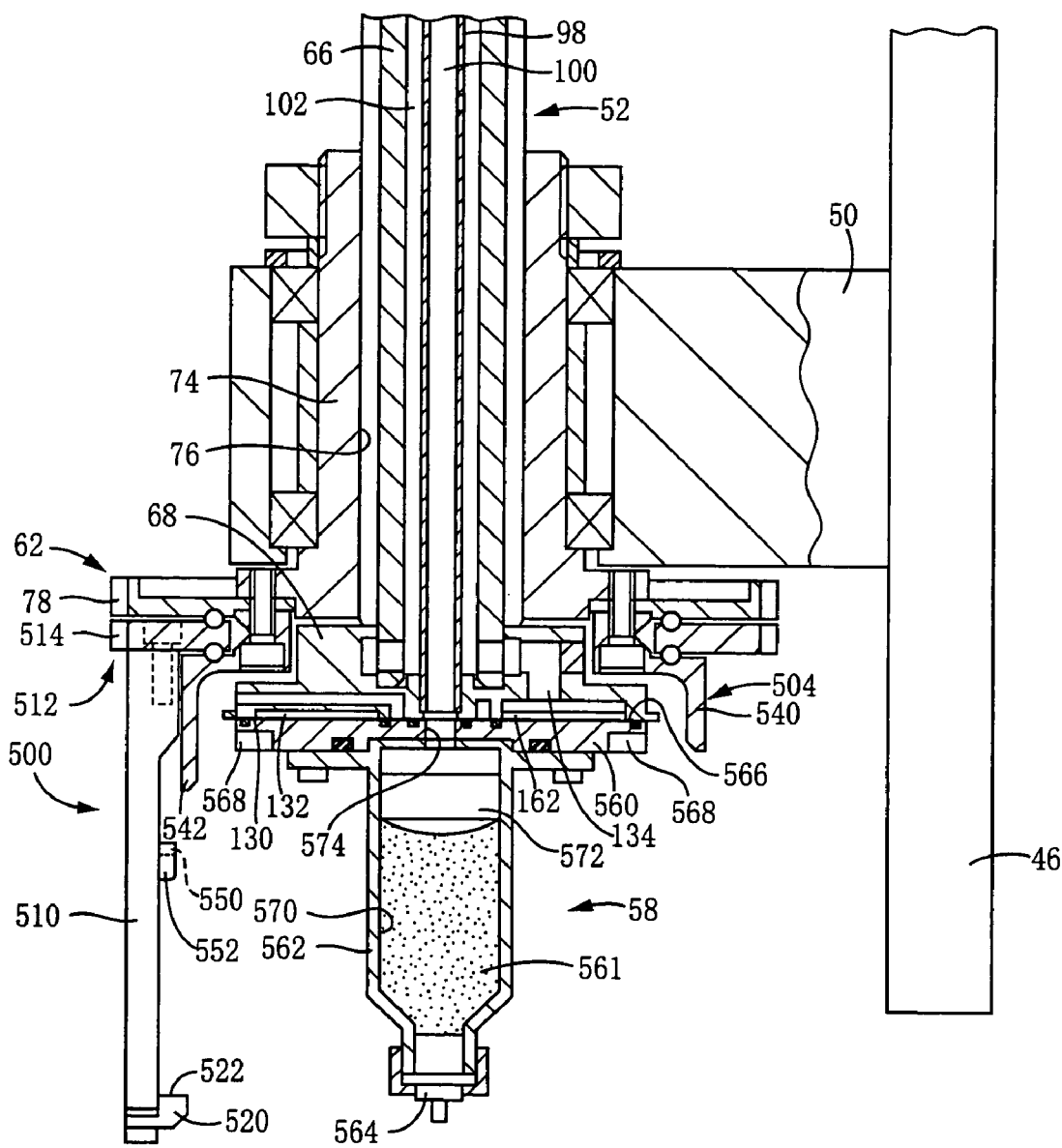
FIG. 17 is a partly cross-sectioned, front elevation view of the electronic-component holding apparatus that holds a dispenser head in place of the single-nozzle head or the revolver head.

Next, the dispenser head 58 will be described by reference to FIG. 17. The dispenser head 58 includes a to-be-held portion 560; an adhesive accommodating portion 562 that accommodates an adhesive 561 as a sort of highly viscous fluid; and an application nozzle 564. The to-be-held portion 560 has a disc-like shape, and a planar surface of the to-be-held portion 560 that is perpendicular to an axis line thereof defines a to-be-held surface or to-be-sucked surface 566. The to-be-held portion 560 has, at two locations diametrically opposite to each other, two recesses 568 that open downward. The adhesive accommodating portion 562 has an adhesive chamber 570 that accommodates the adhesive 561, and a float member 572 as an adhesive pushing member gas-tightly fits in the adhesive chamber 570 such that the float member 572 is movable in an axial direction of the chamber 570. In a state in which the dispenser head 58 is held by the head holding member 52, the adhesive chamber 570 communicates with the positive-pressure supply passage 100 via a through passage 574 formed in the to-be-held portion 560. Therefore, owing to the supplying of the positive pressure to the adhesive chamber 570, the adhesive 561 is outputted from the application nozzle 564.

Figure 18:
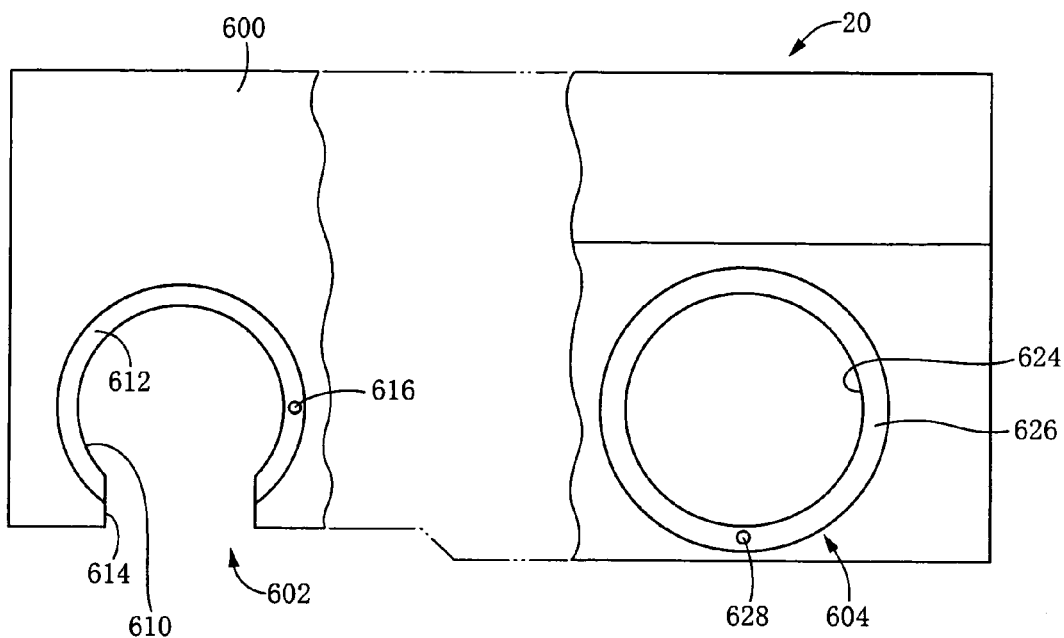
FIG. 18 is a plan view of a portion of a head storage device.
Figure 19:
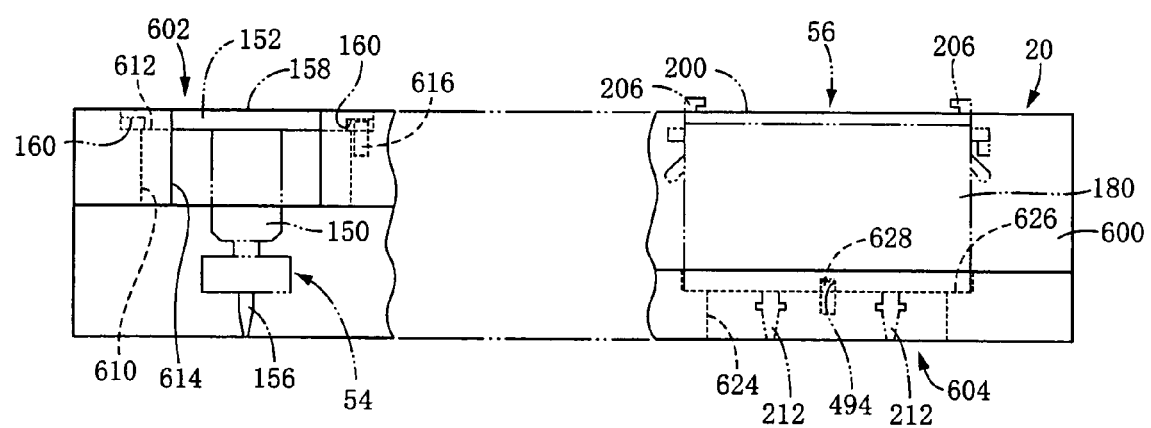
FIG. 19 is a side view of the portion of the head storage device.

Next, the head storage device 20 will be described by reference to FIGS. 1, 18 and 19. As illustratively shown in FIG. 1, the head storage device 20 is provided above the circuit-substrate conveying device 22, and within a movement area where the electronic-component holding apparatus 10 is allowed to move. As shown in FIGS. 18 and 19, the head storage device 20 includes a main member 600 having a plurality of single-nozzle-head storage portions 602; a plurality of revolver-head storage portions 604; and a dispenser-head storage portion (not shown). Each of the single-nozzle-head storage portions 602 includes a receiving hole 610 that is formed through a thickness of the main member 600; and a support surface 612 that surrounds the receiving hole 610. The support surface 612 is partially cut off to form an opening 614 that communicates with the receiving hole 610, and a pin 616 as a positioning portion projects upward from the support surface 612. One single-nozzle head 54 is received by one receiving hole 610, such that the to-be-held portion 152 is supported by the support surface 612 and one of the two recesses 160 fits on the pin 616. Thus, the single-nozzle head 54 is stored in the head storage device 20, such that the head 54 has an angular position defined by the fitting of the pin 616 in one of the two recesses 160. The dispenser-head storage portion has a construction identical with that of each single-nozzle-head storage portion 602, and the dispenser head 58 is received by a receiving hole of the dispenser-head storage portion, such that the to-be-held portion 560 is supported by a support surface of the dispenser-head storage portion. The support surface of the dispenser-head storage portion is so formed as to assure that the to-be-sucked surface 566 of the dispenser head 58 being supported by the support surface is level with the to-be-sucked surface 158 of each single-nozzle head 54.

Each of the revolver-head storage portions 604 includes a receiving hole 624 having a circular cross section; and a support surface 626 that surrounds the receiving hole 624. A pin 628 as a positioning portion projects upward from the support surface 626. One revolver head 56 is received by one receiving hole 610, such that an outer peripheral portion of the main body 180 is supported by the support surface 626, and the recess 494 fits on the pin 628. Thus, the revolver head 56 is stored in the head storage device 20, such that the head 56 has an angular position defined by the fitting of the pin 628 in the recess 494. The support surface 626 is formed at a position lower than a position where the support surface 612 of each single-nozzle-head storage portion 602 is formed, so that the to-be-sucked surface 200 of each revolver head 56 being received by one revolver-head storage portion 604 is level with the to-be-sucked surfaces 158, 566. The head storage device 20 can store a plurality of sorts of revolver heads 56 that hold different numbers of suction nozzles 212 and/or different sorts of suction nozzles 212 (e.g., suction nozzles 212 whose suction pipes have different diameters), and additionally stores a plurality of sorts of single-nozzle heads 54 that hold different sorts of suction nozzles 212.

As shown in FIG. 20, the control device 24 is essentially constituted by a computer 650, and controls the X-axis-direction moving device 40, the Y-axis-direction moving device 42, etc. via respective drive circuits 652.

The electronic-component mounting system, constructed as described above, receives the circuit substrate 32 on which solder cream has been applied to one or more component-mount positions by a screen-printing system, and one single-nozzle head 54 or one revolver head 56 of the mounting system mounts the electronic components 154 on the circuit substrate 32. The head holding member 52 is controlled to hold one nozzle head 54, 56 that can most efficiently mount one or more electronic components 154 on a circuit substrate 32, depending upon a total number, and a sort(s), of the electronic components 154 to be mounted.

First, there will be described a manner in which one single-nozzle head 54 is used to mount one or more electronic components 154 on a circuit substrate 32. As shown in FIG. 2, the single-nozzle head 54 that is held, by suction, by the nozzle holding member 52 is moved to the component supplying device 12 or 14, is stopped right above one electronic component 154, and is moved downward to hold, by suction, the electronic component 154. When the suction nozzle 156 holds the electronic component 154, the negative pressure is supplied to the positive-pressure supply passage 100. After the holding of the component 154, the single-nozzle head 54 is moved upward, and is moved to above the circuit substrate 32. During this movement of the head 54, an image of the electronic component 154 held by the suction nozzle 156 is taken by one of the two component-image taking systems 47, and positional errors of the component 154 held by the nozzle 156 are determined based on the taken image by an image processing computer 651. The thus determined positional errors include X-axis-direction and Y-axis-direction errors that are corrected, together with X-axis-direction and Y-axis-direction errors of the corresponding component-mount position on the circuit substrate 32, by correcting X-axis-direction and Y-axis-direction positions to which the electronic-component mounting apparatus 10 is to be moved. The determined positional errors additionally include an angular-positional error that is corrected by rotating the single-nozzle head 54 about its axis line. Then, the single-nozzle head 54 is moved downward to mount the electronic component 154 at the component-mount position on the circuit substrate 32. To this end, the supplying of the negative pressure to the positive-pressure supply passage 100 is stopped, and the positive pressure is supplied to the same passage 100, so that the suction nozzle 156 positively releases the electronic component 154. Meanwhile, when the suction nozzle 156 is cleaned, a higher positive pressure than the positive pressure used to release each electronic component 154 is supplied to the positive-pressure supply passage 100.

When the current single-nozzle head 54 is replaced with one revolver head 56, the electronic-component holding apparatus 10 is moved to the head storage device 20 to exchange the nozzle heads 54, 56 with each other. More specifically described, the holding apparatus 10 is moved to one "empty" single-nozzle-head storage portion 602 and, in a state in which the to-be-held portion 152 of the single-nozzle head 54 is kept at a position higher than the upper surface of the storage portion 602, the main body 150 of the head 54 is moved into the receiving hole 610 through the opening 614. Then, in a state in which the axis line of the head holding member 52 is aligned with a centerline of the receiving hole 610 and one of the two recesses 160 has the same angular phase as that of the pin 616, the head holding member 52 is moved downward. Thus, the single-nozzle head 54 is placed on the support surface 612, such that the to-be-held portion 152 is positioned by the pin 616. Since the lever drive member 510 is kept at an angular phase opposite to the opening 614, the drive member 510 can be prevented from interfering with the main member 600 of the storage device 20. After the placing of the single-nozzle head 54, the supplying of the negative pressure to the negative-pressure supply passage 102 is stopped, and accordingly the head 54 is released.

After the releasing of the single-nozzle head 54, the head holding member 52 is moved upward, and is moved to above one revolver-head storage portion 604. More specifically described, the axis line of the head holding member 52 is aligned with the axis line of the revolver head 56, and the head holding member 52 is rotated, if necessary, to take an angular position at which the three engaging projections 142 are not aligned with the three engaging projections 206 of the first plate member 184. In this state, the head holding member 52 is moved downward. In addition, the lever drive member 510 is positioned at an interference avoiding position where the drive member 510 does not interfere with the main member 600 of the head storage device 20. The interference avoiding position of the lever drive member 510 is an angular phase thereof corresponding to the interference avoiding portion 217 of the main body 180 of the revolver head 56. The head holding member 52 is rotated in a state in which the suction surface 130 is held in contact with the to-be-sucked surface 200, so that each of the three engaging projections 142 enters a clearance present between a corresponding one of the three engaging projections 206, and the to-be-sucked surface 200, and has the same angular phase as that of the one engaging projection 206. In this state, the head holding member 52 and the revolver head 56 cannot be moved away from each other in the radial or axial direction of the member 52 or the head 52. Therefore, even if an external force may be exerted to the revolver head 56 in a direction to remove the head 56 away from the head holding member 52, the head 56 does not come off the holding member 52. In the present embodiment, the engaging projections 142, 206 cooperate with each other to constitute a coming-off preventing device. The suction surface 130, held in contact with the to-be-sucked surface 200, cooperates with the to-be-sucked surface 200 to define the head-related negative-pressure chamber 204. In this state, the negative-pressure source 110 supplies the negative pressure to the negative-pressure chamber 204 via the negative-pressure supply passage 102. Thus, the revolver head 56 is held, by suction, by the head holding member 52, such that the revolver head 56 takes a vertical posture and is coaxial with the holding member 52. Therefore, when the head holding member 52 is vertically moved, or rotated, the revolver head 56 is also vertically moved, or rotated. In addition, the first positive-pressure supplying system 262 communicates with the positive-pressure supply passage 100, so that the positive pressure is supplied to the revolver head 56. Since the positive-pressure source 122 supplies the high positive pressure, the respective current positions of the first and second valve spools 280, 310 can be maintained. Furthermore, the through passage, not shown, formed in the first plate member 184 is communicated with the negative-pressure-chamber defining recess 132, so that the first negative-pressure supplying system 260 is communicated with the negative-pressure supply passage 102 via the negative-pressure-chamber defining recess 132 and accordingly the negative pressure is supplied to the revolver head 56. In the present embodiment, the negative-pressure supply passage 102 constitutes a portion of a second negative-pressure supplying system; and the head-related negative-pressure passage also functions as the negative-pressure supply passage 102 of the second negative-pressure supplying system. However, the through passages, not shown, which are formed in the first plate member 184 and through which the through passages 348 are communicated with the negative-pressure supply passage 102 may be so formed as to open in the negative-pressure-chamber defining recess 202. In addition, the negative-pressure-chamber defining recess 202 may be omitted.

After the holding of the revolver head 56, the head holding member 52 is moved upward, so that the revolver head 56 comes out of the receiving hole 624. Then, the head holding member 52 is moved to the component supplying device 12 or 14, so as to take the electronic components 154 from the supply device 12, 14. The revolver head 56 is revolved so as to move sequentially each of the twelve suction nozzles 212 to a component suction position where the each suction nozzle 212 applies suction to an electronic component 154 and thereby holds the component 154. In the present embodiment, a position that is located on a locus of revolving of each suction nozzle 212 and is the nearest to the feeder-type component supplying device 12 in the Y-axis direction is used as the component suction position.

When each revolver head 56 is stored in the head storage device 20, the outer peripheral portion of the main body 180 of the revolver head 56 is supported by the support surface 626. In this state, all the first valve spools 280 are kept at their positive-pressure supply positions, and all the second valve spools 310 are kept at their negative-pressure supply positions. Therefore, before the revolver head 56 starts sucking the electronic components 154, the head holding member 52 is moved upward to its upward-movement end position so as to reset all the first and second valve spools 280, 310 to their initial positions. Before the head holding member 52 reaches its upward-movement end position, all the first ordinary resetting portions 540 engage the respective first to-be-engaged portions 290 of all the first valve spools 280, and all the second ordinary resetting portions 542 engage the respective second to-be-engaged portions 320 of all the second valve spools 310, so that the first and second valve spools 280, 310 are all moved downward relative to the main body 180 and are returned to their initial positions. To this end, the supplying of the positive pressure to the positive-pressure supply passage 100 is stopped, and accordingly the respective current positions of the first and second valve spools 280, 310 cannot be fixed by the positive pressure. Thus, the first and second valve spools 280, 310 can be smoothly returned. In addition, one or more pivotable levers 224 may be additionally returned to their initial positions. After the resetting of the first and second valve spools 280, 310, the positive pressure is again supplied to the positive-pressure supply passage 100, so that the respective current positions of the first and second valve spools 280, 310 in the axial direction of the main body 180 can be maintained by the positive pressure. During the resetting operation, the lever drive member 510 is positioned at the interference avoiding position, so as to prevent the first and second special resetting portions 550, 552 from interfering with the pivotable levers 224 or the first and second valve spools 280, 310. This is also the case with the lever drive member 510 when the revolver head 56 is moved downward, after the resetting, so as to hold and mount the electronic components 154.

Figure 21:
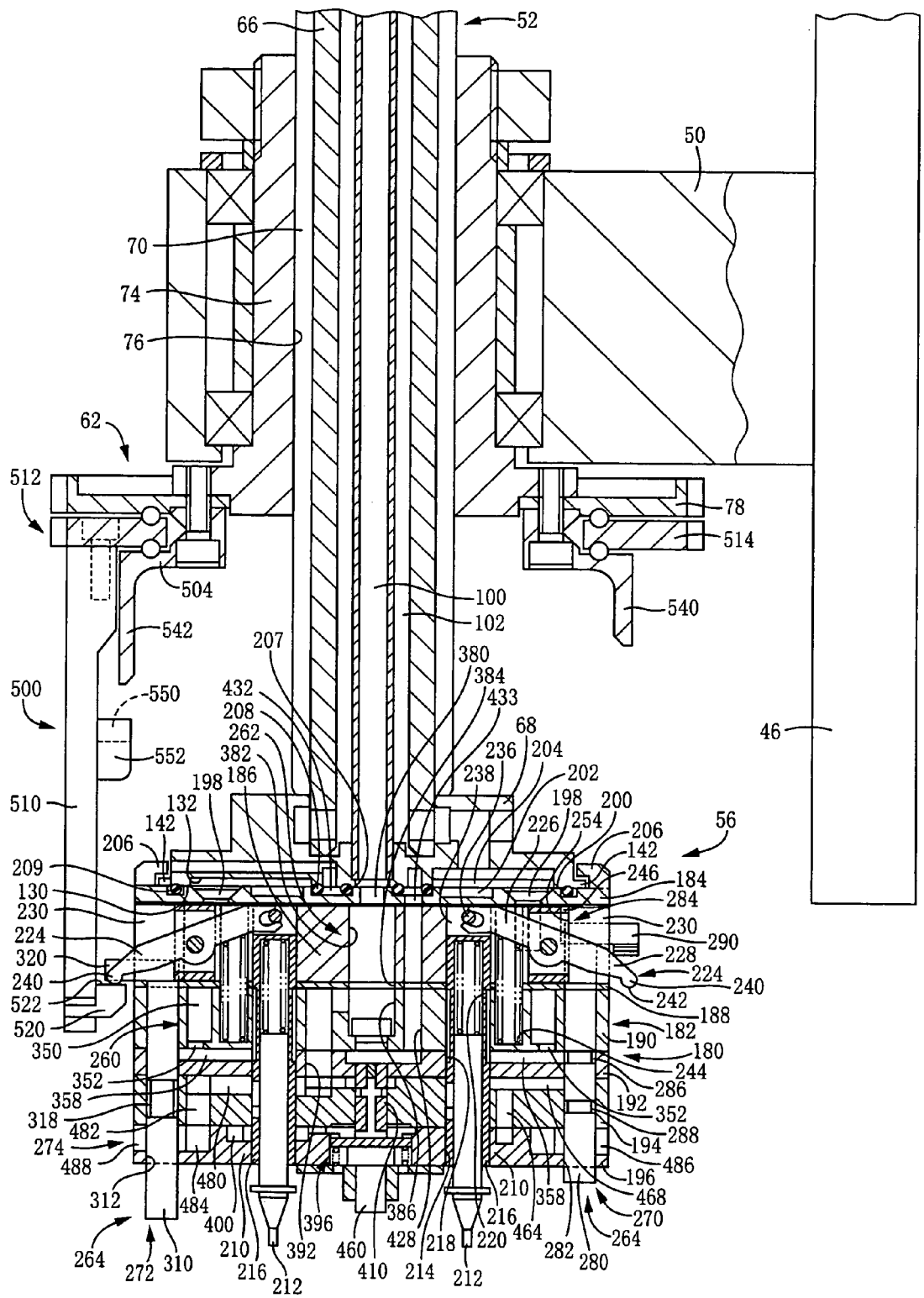
FIG. 21 is a partly cross-sectioned, front elevation view showing a state in which the revolver head has been moved downward from its upward-movement end position.
Figure 22A:
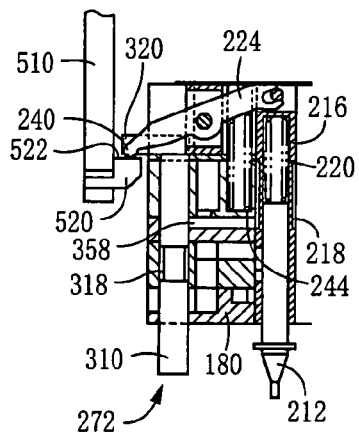
FIGS. 22A, 22B, 22C, 22D, 22E, 22F, 22G, 22H, and 22I show respective steps in which a valve device is switched when an electronic component is held by suction and the component is mounted.
Figure 22D:
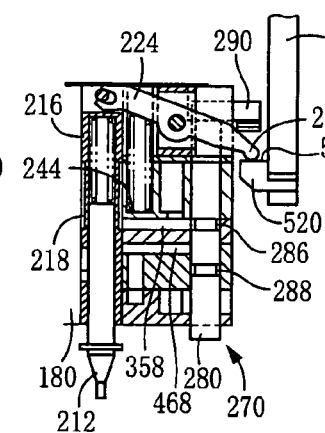

When the revolver head 56 holds an electronic component 154, the lever drive member 510 is positioned at the above-described second switching position for (a) the pivotable lever 224 connected to the suction nozzle 212 being positioned at the component suction position, and (b) the valve device 264 corresponding to the suction nozzle 212. Therefore, when the head holding member 52 is moved downward, first, the part-cylindrical to-be-engaged portion 240 of the pivotable lever 224 engages, as shown in FIGS. 21 and 22A, the engaging surface 522 of the lever drive member 510, and then the second to-be-engaged portion 320 of the second valve spool 310 engages the engaging surface 522. When the head holding member 52 is further moved downward, as shown in FIGS. 22B and 22C, the pivotable lever 224 is pivoted and accordingly the suction nozzle 212 is moved downward. In addition, the second valve spool 310 is moved upward relative to the main body 180, and is positioned at its negative-pressure supply position. Since, however, the first to-be-engaged portion 290 of the first valve spool 290 does not engage the engaging surface 522, the first valve spool 280 remains at its initial position. Thus, the negative pressure is supplied to the suction nozzle 212, and the suction nozzle 212 can hold, by suction, the electronic component 154.

Each of the component supplying devices 12, 14 is adapted to hold different sorts of electronic components 154 such that even if those components 154 may have different thickness values, i.e., different dimensions in a vertical direction, respective upper surfaces of those components 154 have a same height position. Therefore, when the revolver head 56 holds each one of the electronic components 154, the head holding member 52 is moved downward by a predetermined distance. After the holding of one electronic component 154, the head holding member 52 is moved upward. Though the second valve spool 310 is maintained at its negative-pressure supply position by the spool-position maintaining device 274, the pivotable lever 224 is pivoted to its initial position by the biasing force of the spring 244, so that the suction nozzle 212 is moved upward and the electronic component 154 is picked up from the component supplying device 12, 14. Since the annular groove 218 of the nozzle holder 216 is elongate in the axial direction of the holder 216, the negative pressure can be supplied to the suction nozzle 212, irrespective of whether the nozzle 212 is moved upward or downward. While the revolver head 56 holds and mounts the electronic components 154, the head holding member 52 is not moved to its upward-movement end position, more specifically described, is moved to just a special position at which the to-be-engaged surface 242 of the to-be-engaged portion 240 of the pivotable lever 224 being positioned at its initial position is somewhat higher than the engaging surface 522 of the lever drive member 510. Thus, the lever drive member 510 is prevented from being revolved relative to the revolver head 56 in a state in which the to-be-engaged surface 242 is in contact with the engaging surface 522. This special position of the head holding member 52 is higher than the above-described special resetting position, and will be referred to as the holding-and-mounting-related upward-movement end position of the head holding member 52.

As the revolver head 56 is revolved, the twelve suction nozzles 212 are sequentially moved to the component suction position where each of the suction nozzles 212 holds, by suction, an electronic component 154. After all the suction nozzles 212 have picked up respective electronic components 154, the electronic-component holding apparatus 10 is moved to above the circuit substrate 32, and mounts the components 154 on the substrate 32. During the movement of the apparatus 10, one of the two component-image taking systems 47 takes respective images of the respective electronic components 154 held by the twelve suction nozzles 212, all at once. Based on the taken image of each of the electronic components 154, positional errors of the each component 154 are determined.

Owing to the movement of the electronic-component holding apparatus 10, the twelve suction nozzles 212 are sequentially moved to above the corresponding component-mount positions on the circuit substrate 32. An angular-positional error of each of the respective electronic components 154 held by the suction nozzles 212 is corrected by rotating the revolver head 56. The lever drive member 510 is revolved or moved to an angular phase corresponding to the suction nozzle 212 to mount the next electronic component 154, more specifically described, the above-described first switching position for that suction nozzle 212 and the valve device 264 corresponding to the nozzle 212. The X-axis-direction and Y-axis-direction positional errors of the electronic component 154 held by the suction nozzle 212, X-axis-direction and Y-axis-direction positional errors of the component 154, caused by the correction of the angular-positional error thereof, and X-axis-direction and Y-axis-direction positional errors of the corresponding component-mount position on the circuit substrate 32 are corrected by correcting a position to which the electronic-component holding apparatus 10 is moved. After the suction nozzle 212 is moved to above the component-mount position, the head holding member 52 is moved downward. During this downward movement of the holding member 52, first, the to-be-engaged portion 240 of the pivotable lever 224 engages, as shown in FIG. 22D, the engaging surface 522 of the lever drive member 510, so that the lever 224 is pivoted and the suction nozzle 212 is moved downward. Eventually, as shown in FIG. 22E, the annular groove 218 is communicated with the radial-direction groove 468, so that the positive pressure is supplied to the suction nozzle 212.

Subsequently, the engaging surface 522 engages one of the first to-be-engaged surfaces 296, 298, 300, 302 of the first valve spool 280, so that the first valve spool 280 is moved upward relative to the main body 180. FIG. 13 shows an example in which the engaging surface 522, indicated by two-dot chain lines, engages one 296 of the four first to-be-engaged surfaces 296 through 302. Since the first valve spool 280 is moved upward relative to the main body 180, the annular groove 288 is moved away, as shown in FIG. 22E, from the grooves 356, 358, so that the negative pressure is not supplied to the suction nozzle 212 any longer. When the head holding member 52 is further moved downward, the first valve spool 280 is moved to its positive-pressure supply position where the annular groove 288 is communicated, as shown in FIG. 22F, with the grooves 466, 468, so that the positive pressure is supplied to the suction nozzle 212. This positive pressure has been reduced by the pressure reducing valve 396. Thus, the electronic component 154 placed on the circuit substrate 32 is positively released from the suction nozzle 212. Then, the head holding member 52 is moved upward. During this movement, the first valve spool 280 is maintained at its positive-pressure supply position by the spool-position maintaining device 274, whereas the pivotable lever 224 is pivoted by the biasing force of the spring 244, so that the suction nozzle 212 is moved upward. Thus, the annular groove 218 is moved away from the radial-direction groove 468, and accordingly the positive pressure is not supplied to the suction nozzle 212 any longer. Since, however, the first valve spool 280 inhibits the supplying of the negative pressure to the suction nozzle 212, the nozzle 212 does not apply suction to the electronic component 154 mounted on the circuit substrate 32.

Figure 22G:
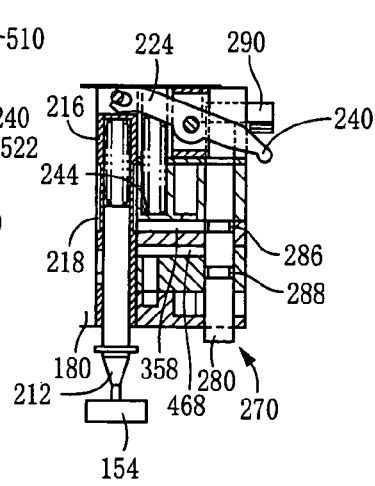
Figure 22B:
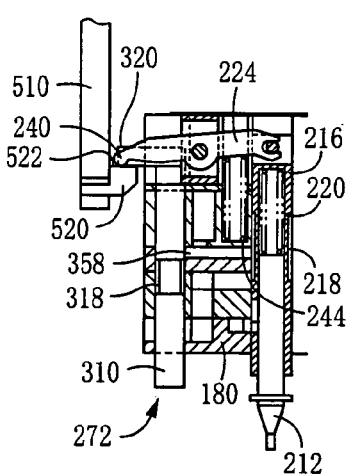
Figure 22E:
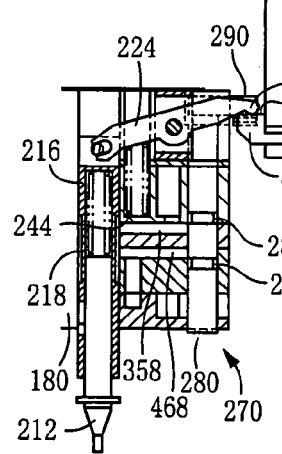
Figure 22H:
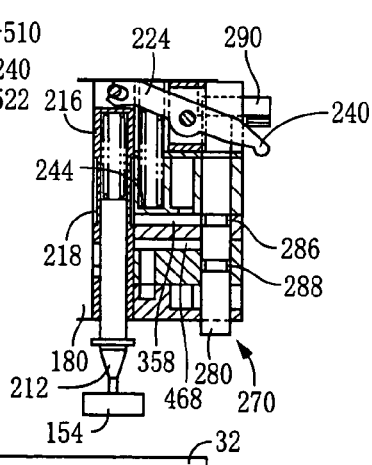
Figure 22C:
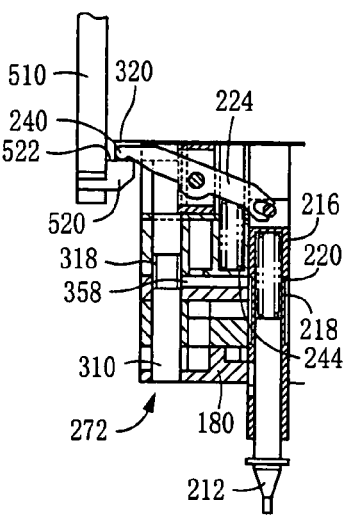
Figure 22F:
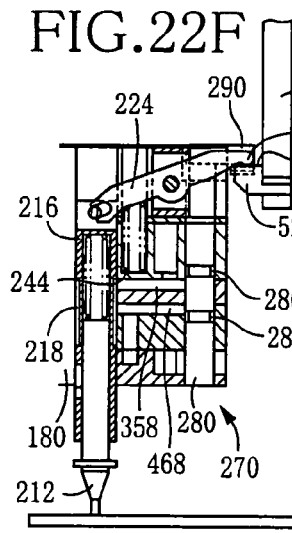
Figure 22I:
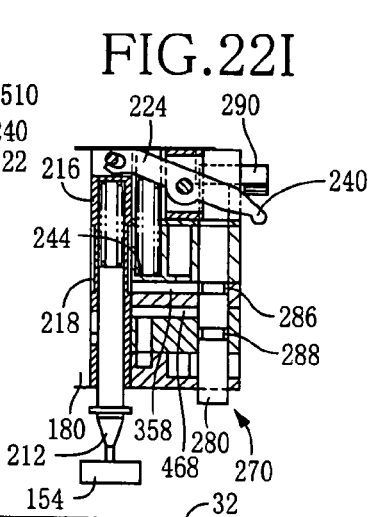

When the revolver head 56 is moved downward to mount one of the electronic components 154, the other suction nozzles 212 (and the corresponding first valve spools 280) than the suction nozzle 212 holding the one component 154 to be mounted next, are also moved downward with the revolver head 56, as shown in FIGS. 22G, 22H, and 22I. Since, however, those other suction nozzles 212 are not aligned with the lever drive member 510, the pivotable members 224 corresponding to those other nozzles 212 are not pivoted, those other first valve spools 280 are not moved to their positive-pressure supply positions, and those other nozzles 212 do not release the respective electronic components 154, i.e., continue to hold the respective components 154.

One of the four first to-be-engaged surfaces 296 through 302 that is to be engaged with the lever drive member 510 is selected depending upon the thickness (i.e., height) of each electronic component 154. The lever drive member 510 is revolved to different angular phases that correspond to different thickness or height values of electronic components 154, such that the thicker or higher electronic components 154 are mounted, the lower to-be-engaged surfaces 296 through 302 are engaged with the engaging surface 522. Each of those different angular phases defines the first switching position. Thus, in the present embodiment, each of the first valve spools 280 has a plurality of first switching positions, e.g., four first switching positions. Since the lever drive member 510 is revolved to a selected one of the four angular phases corresponding to different thickness values of electronic components 154, the engaging surface 522 engages, when the head holding member 52 is moved downward, a corresponding one of the four first to-be-engaged surfaces 296 through 302 at a corresponding one of four different timings, so that the each first valve spool 280 is switched at a corresponding one of four different timings. Therefore, irrespective of the respective different thickness values of the electronic components 154, the supplying of the negative pressure can be stopped just before each of the components 154 is contacted with the circuit substrate 32, and additionally the positive pressure is supplied to the suction nozzle 212 around the time when the each component 154 is contacted with the substrate 32. A downward-movement end position of the revolver head 56 when the head 56 mounts electronic components 154 can be changed depending upon respective thickness values of the components 154. However, irrespective of the respective different thickness values of the electronic components 154, a distance of movement of each first valve spool 280 relative to the main body 180 is not changed, i.e., is constant. Therefore, the earlier the engaging surface 522 engages any one of the first to-be-engaged surfaces 296 through 302, the earlier each first valve spool 280 reaches its positive-pressure supply position. Thus, the downward-movement end position of the revolver head 56 is changed such that the downward movement of the head 56 is stopped immediately after each first valve spool 280 has reached its positive-pressure supply position. Because of the above-described ratio of one of the respective lengths of the first and second arms 226, 228 of each pivotable lever 224, to the other length, the distance of downward movement of the suction nozzle 212 is twice the distance of downward movement of the head holding member 52. Therefore, a regular stepwise difference of the first to-be-engaged surfaces 296 through 302 is half a difference of respective thickness (or height) values of two sorts of electronic components 154. Thus, irrespective of which one of the first to-be-engaged surfaces 296 through 302 may be selected and engaged with the engaging surface 522, the switching of the first valve spool 280 to its positive-pressure supply position will occur at the same timing with respect to the timing when the electronic component 154 held by the suction nozzle 212 is mounted on the circuit substrate 32.

If one of the suction nozzles 212 fails to hold normally an electronic component 154, the component 154 is discarded before the revolver head 56 starts mounting the electronic components 154 held thereby, on the circuit substrate 32. More specifically described, the electronic-component holding apparatus 10 is moved to above a discarded-component collection box (not shown), and the lever drive member 510 is moved to the first switching position for the one suction nozzle 212 holding the electronic component 154 to be discarded, and the valve device 264 corresponding to the nozzle 212. In this state, the head holding member 52 is moved downward, and the engaging surface 522 engages the pivotable lever 224 and the first valve spool 280, so that the suction nozzle 212 is moved downward and the first valve spool 280 is moved upward to its positive-pressure supply position. Thus, in place of the negative pressure, the positive pressure is supplied to the suction nozzle 212. In the present embodiment, the first switching position to which the lever drive member 510 is moved is an angular phase of the drive member 520 that corresponds one of the four to-be-engaged surfaces 296 through 302 of the first valve spool 280 that is pre-programmed to be engaged with the engaging surface 522 when the electronic component 154 to be discarded is otherwise mounted on the circuit substrate 32. This first switching position is a special switching position. Likewise, the head holding member 52 is moved downward to the same position as the position to which the holding member 52 is pre-programmed to be moved downward when the component 154 to be discarded is otherwise mounted on the substrate 32. In addition, the pressure-reduction canceling member 460 is moved to the pressure-reduction canceling position by a drive member (not shown), so that the pressure-reduction canceling member 460 is placed in its inoperative state. Thus, the positive pressure is supplied, without being reduced, to the suction nozzle 212, so that the electronic component 154 is assuredly released from the nozzle 212 and is discarded into the discarded-component collection box. After the discarding of the electronic component 154, the drive member stops driving the pressure-reduction canceling member 460, so that the canceling member 460 is returned to the pressure-reduction allowing position, so that the canceling member 460 is placed in its operative state. In the present embodiment, the lever drive member 510 as the ordinary valve switching member also functions as a special valve switching member; and the special resetting member (i.e., the first and second special resetting portions 550, 552) integral with the lever drive member 510 is integral with the special valve switching member. In addition, the nozzle elevating and lowering device 500 also functions as a special valve switching device; and the nozzle-elevating-and-lowering-device revolving device 512 also functions as a special-valve-switching-device revolving device. However, one of the first to-be-engaged surfaces 296 through 302 that is engaged with the engaging surface 522 when the electronic component 154 is discarded is not limited to the to-be-engaged surface that is pre-programmed to be engaged with the engaging surface 522 when the component 154 is mounted. For example, it is possible to use, irrespective of the sorts of electronic components 154, a pre-selected one of the four to-be-engaged surfaces 296 through 302 so that the pre-selected surface is engaged with the engaging surface 522. In this case, a position to which the head holding member 52 is moved downward is so determined as to correspond to the pre-selected surface to be engaged with the engaging surface 522.

After the suction nozzle 212 discards the electronic component 154, the nozzle 212 holds, by suction, another electronic component 154. To this end, the first and second valve spools 280, 310 corresponding to the suction nozzle 212 are returned to their initial positions. More specifically described, the lever drive member 510 is revolved to an angular phase corresponding to the suction nozzle 212 that has discarded the electronic component 154, and the valve device 264 corresponding to the nozzle 212. In addition, the head holding member 52 is moved upward to the special resetting position. Consequently the first and second special resetting portions 550, 552 engage only the pivotable lever 224 and the first and second valve spools 280, 310 that correspond to the suction nozzle 212, and return the first and second valve spools 280, 310 to their initial positions. Thus, the head holding member 52 is moved upward to the special resetting position lower than the ordinary resetting position, and accordingly the other second valve spools 310 corresponding to the other suction nozzles 212 that normally hold the respective electronic components 154, are not returned to their initial positions, that is, the other suction nozzles 212 continue to hold the respective components 154.

When the suction nozzles 212 are cleaned, the pressure-reduction canceling member 460 is moved to the pressure-reduction canceling position by the above-described drive member, or an operator. Then, one of the suction nozzles 212 is moved downward so as to communicate with the first positive-pressure supply channel 262, and the corresponding first valve spool 280 is moved to its positive-pressure supply position. Thus, the high positive pressure is supplied, without being reduced, to the one suction nozzle 212, so as to blow off the dust present in the nozzle 212.

In the case where an adhesive is applied to a circuit substrate 32 and then electronic components 154 are mounted on the circuit substrate 32, one dispenser head 58 is held, by suction, by the head holding member 52, and thus is taken from the head storage device 20. Subsequently, the head holding member 52 is moved to a predetermined adhesive application position where the dispenser head 58 applies the adhesive to the circuit substrate 32. After the application of the adhesive, the head holding member 52 returns the dispenser head 58 to the head storage device 20, and holds one single-nozzle head 54 or one revolver head 56 so as to mount the electronic components 154 on the circuit substrate 32. The head holding member 52 takes and returns the dispenser head 58 from and to the head storage device 20, in the same manner as the above-described manner in which the head holding member 52 takes and returns each single-nozzle head 54 from and to the storage device 20.

In the case where, after the revolver head 56 has mounted all the electronic components 154 held thereby, on the circuit substrate 32, the head 56 mounts additional electronic components 154, the head holding member 52 is moved to its upward-movement end position, so that all the pivotable levers 224 and all the first and second valve spools 280, 310 are reset or returned to their initial positions. However, in the case where, after the mounting of the electronic components 154, the revolver head 56 is returned to the head storage device 20, the first or second valve spools 280, 310 are not returned to their initial positions and the head holding member 52 is just moved to the head storage device 20. More specifically described, the axis line of the head holding member 52 is aligned with the axis line of the receiving hole 624 of one revolver-head storage portion 602, and the recess 494 is angularly aligned with the pin 628. In this state, the head holding member 52 is moved downward, so that the revolver head 56 is placed on the support surface 626 and the pin 628 fits in the recess 494. In addition, in a state in which the negative pressure is not supplied to the negative-pressure passage 102, the head holding member 52 is rotated by an appropriate angle, so that the engaging projections 142 take respective angular phases different from those of the corresponding engaging projections 206 and accordingly are disengaged from the same 206. In this state, the head holding member 52 is moved upward. During this head-returning operation, the lever drive member 510 is positioned at the interference avoiding position. Thus, the revolver head 56 is stored in, and taken out of, the head storage device 20, in the state in which an angular position of the revolver head 56 is defined or fixed by the fitting of the pin 628 in the recess 494. Therefore, for example, the head holding member 52 can hold the revolver head 56 in a manner in which an angular position of the revolver head 56 relative to the holding member 52 is known to the control device 24. Thus, an order in which the plurality of suction nozzles 212 sequentially hold, or mount, respective electronic components 154 can be easily controlled by the control device 24.

In the case where the head holding member 52 holds each single-nozzle head 54 stored in the head storage device 20, first, the holding member 52 is moved downward, and the suction surface 130 is held in contact with the to-be-sucked surface 158, in the state in which the axis line of the holding member 52 is aligned with the axis line of the to-be-held portion 152. Thus, the head-related negative-pressure chamber 162 is formed or defined, and the negative pressure is supplied to the chamber 162, so that the each single-nozzle head 54 is held, by suction, by the holding member 52. Subsequently, the head holding member 52 is moved upward and further is moved on the horizontal plane, in a sequence reverse to the sequence in which each single-nozzle head 54 is stored in the head storage device 20. Thus, each single-nozzle head 54 is taken out of the head storage device 20. That is, each of the heads 54, 56, 58 is automatically exchanged with another head. In the present embodiment, the electronic-component-holding-apparatus moving device 18, the head-holding-member elevating and lowering device 60, the head rotating device 62, and an automatic-head-exchange control portion of the control device 24 that controls those elements 18, 60, 62 to exchange the heads 54, 56, 58 with each other cooperate with each other to constitute an automatic head-exchanging device.

Each single-nozzle head 54 may be provided with a valve device that mechanically switches the supplying of the negative pressure from the second negative-pressure supplying system to the suction nozzle 156 and the supplying of the positive pressure from the second positive-pressure supplying system to the nozzle 156, to and from each other.

The second to-be-engaged surface 322 of the second to-be-engaged portion 320 of each second valve spool 310 may have a plurality of different positions or surfaces in a direction parallel to an axial direction of the each valve spool 310, like the first to-be-engaged surfaces 296 through 302 of the first to-be-engaged portion 290 of each first valve spool 280. In this case, for example, when the suction nozzles 212 hold, by suction, respective electronic components 154, the negative pressure may be supplied to the suction nozzles 212 at different timings corresponding to respective thickness values of those electronic components 154.

The first and second ordinary resetting portions 540, 542 of the ordinary resetting member 504 may be modified such that first and second ordinary resetting portions have a same height position. The first and second ordinary resetting portions having the same height position can reset or return the first and second valve spools 280, 310 to their initial positions, if the first and second to-be-engaged portions 290, 320 of the first and second valve spools 280, 310, being positioned at their positive-pressure and negative-pressure supply positions, respectively, have respective appropriate height positions. This is also the case with the first and second special resetting portions 550, 552.

The switching of each valve device 264 and/or the relative movement of each suction nozzle 212 and the main body 180 may be performed independent of the upward or downward movement of the head holding member 52.

It is to be understood that the present invention is not limited to the details of the following embodiments but may be embodied with various changes and modifications, such as those described in SUMMARY OF THE INVENTION, that may occur to a person skilled in the art.

What is claimed is:

1. An electronic-component holding apparatus, comprising:
   a plural-nozzle head including a main body which holds a plurality of suction nozzles such that the suction nozzles extend parallel to each other and hold respective electronic components, wherein the main body includes a to-be-held portion; and
   a head holding member including a head holding portion which holds the main body of the plural-nozzle head by application of suction to the to-be-held portion thereof,
   wherein at least one of the head holding portion and the to-be-held portion has a negative-pressure-chamber defining recess which is connected to a head-related negative-pressure supply passage and which cooperates with an other of the head holding portion and the to-be-held portion to define a head-related negative-pressure chamber which is supplied with a head-related negative pressure through the head-related negative-pressure supply passage so as to attach, by the suction caused by the head-related negative pressure, the to-be-held portion of the main body of the plural-nozzle head to the head holding portion of the head holding member, and wherein when the head-related negative-pressure chamber is not supplied with the head-related negative pressure through the head-related negative-pressure supply passage, the to-be-held portion of the main body of the plural-nozzle head is detachable from the head holding portion of the head holding member.

2. The apparatus according to claim 1, wherein the plural-nozzle head comprises a multiple-nozzle head which holds at least three said suction nozzles such that said at least three suction nozzles are located on a common circle and extend parallel to each other in a direction perpendicular to a plane containing the common circle.

3. The apparatus according to claim 1, wherein the plural-nozzle head has a first negative-pressure supplying system which supplies a nozzle-related negative pressure to each of the suction nozzles; and a first positive-pressure supplying system which supplies a positive pressure to said each suction nozzle, and the head holding member has a second negative-pressure supplying system and a second positive-pressure supplying system which communicate with the first negative-pressure supplying system and the first positive-pressure supplying system, respectively, in a state in which the head holding member holds the arbitrary plural-nozzle head.

4. The apparatus according to claim 3, wherein the first negative-pressure supplying system and the second negative-pressure supplying system communicate with each other via the negative-pressure-chamber defining recess, and the head-related negative-pressure supply passage provides at least a portion of a nozzle-related negative-pressure supply passage of the second negative-pressure supplying system.

5. The apparatus according to claim 3, wherein the plural-nozzle head further has a plurality of valve devices which are associated with the suction nozzles, respectively, and each of which is switchable to an arbitrary one of at least two states including (a) a first state in which said each valve device allows a corresponding one of the suction nozzles to communicate with the first negative-pressure supplying system and (b) a second state in which said each valve device allows said corresponding suction nozzle to communicate with the first positive-pressure supplying system, and wherein the apparatus further comprises:

a main frame which holds the head holding member such that the head holding member is movable relative to the main frame in each of an upward direction and a downward direction that are parallel to a reference direction in which said each suction nozzle extends; and a head-holding-member moving device which moves the head holding member relative to the main frame in said each of the upward direction and the downward direction.

6. The apparatus according to claim 5, further comprising a valve switching device which is held by the main frame and which mechanically switches, owing to a movement of the head holding member relative to the main frame by the head-holding-member moving device, said each valve device to the arbitrary one of said at least two states including the first state and the second state.

7. The apparatus according to claim 6, wherein the plural-nozzle head comprises a multiple-nozzle head which holds at least three said suction nozzles such that said at least three suction nozzles are located on a common circle and extend parallel to each other in a direction perpendicular to a plane containing the common circle, wherein the valve switching device is held by the main frame such that the valve switching device is revolveable about an axis line thereof extending perpendicularly to said plane and passing through a center of the common circle, and wherein the apparatus further comprises a valve-switching-device revolving device which revolves the valve switching device to an arbitrary angular phase about the axis line thereof.

8. The apparatus according to claim 6, wherein said each valve device includes at least one valve spooi which includes a to-be-engaged portion and which is held by the main body of the plural-nozzle head such that said at least one valve spool is movable in the reference direction, wherein the valve switching device includes a valve switching member which engages, when the head holding member is moved in the downward direction, the to-be-engaged portion of said at least one valve spool and thereby moves said at least one valve spool relative to the main body of the plural-nozzle head in the reference direction, and wherein the apparatus further comprises an ordinary resetting member which is held by the main frame and which engages, when the head holding member is moved upward, relative to the main frame, to an ordinary resetting position, said at least one valve spool of said each valve device, and thereby resets said at least one valve spool to a reference position thereof.

9. The apparatus according to claim 8, further comprising a special resetting member which is held by the main frame and which engages, when the head holding member is moved upward, relative to the main frame, to a special resetting position, said at least one valve spool of an arbitrary one of the valve devices, and thereby resets said at least one valve spool to the reference position thereof.

10. The apparatus according to claim 9, further comprising a special valve switching device which is held by the main frame and which engages, when the head holding member is moved upward, relative to the main frame, to a special valve switching position, said at least one valve spool of an arbitrary one of the valve devices, and thereby switches the arbitrary valve device to the second state thereof in which the arbitrary valve device allows a corresponding one of the suction nozzles to communicate with the first positive-pressure supplying system.

11. The apparatus according to claim 5, further comprising a nozzle moving device which is held by the main frame and which mechanically moves, owing to a movement of the head holding member relative to the main frame by the head-holding-member moving device, an arbitrary one of the suction nozzles relative to the main body of the plural-nozzle head in said each of the upward direction and the downward direction.

12. The apparatus according to claim 11, wherein the plural-nozzle head comprises a multiple-nozzle head which holds at least three said suction nozzles such that said at least three suction nozzles are located on a common circle and extend parallel to each other in a reference direction perpendicular to a plane containing the common circle, wherein the nozzle moving device is held by the main frame such that the nozzle moving device is revolveable about an axis line thereof extending perpendicularly to said plane and passing through a center of the common circle, and wherein the apparatus further comprises a nozzle-moving-device revolving device which revolves the nozzle moving device to an arbitrary angular phase about the axis line thereof.

13. The apparatus according to claim 1, wherein the main body of the plural-nozzle head includes a laminated portion which is constituted by at least three plate members which have different gas passages and which are gas-tightly laminated on each other.

14. The apparatus according to claim 13, wherein at least one of the plate members has, in at least one of opposite surfaces thereof, a plurality of grooved portions each of which extends parallel to said at least one surface, and a plurality of through holes each of which is formed through a thickness of said at least one plate member.

15. An electronic-component mounting system, comprising:
- the electronic-component holding apparatus according to claim 1;
- a component supplying device which supplies a plurality of electronic components;
- a substrate holding device which holds a circuit substrate on which the electronic components supplied by the component supplying device are mounted;
- a moving device which moves at least one of the electronic-component holding apparatus, the component supplying device, and the substrate holding device relative to a different one of the electronic-component holding apparatus, the component supplying device, and the substrate holding device, along a plane perpendicular to each of respective axis lines of the suction nozzles; and
- a control device which controls the moving device and the electronic-component holding apparatus so that the electronic-component holding apparatus receives the electronic components from the component supplying device, and mounts the electronic components on the circuit substrate held by the substrate holding device.

16. The electronic-component mounting system according to claim 15,
wherein the control device controls the electronic-component holding apparatus such that the head holding member selectively holds each one of:
  (a) at least one of the plural-nozzle head; and
  (b) at least one single-nozzle head which holds a single suction nozzle holding an electronic component, and
wherein the mounting system mounts, on the single circuit substrate, each one of:
  (c) the electronic components held by the at least one plural nozzle head; and
  (d) the electronic component held by the at least one single nozzle head.

17. The apparatus according to claim 1, comprising a plurality of plural-nozzle heads, wherein the head holding portion of the head holding member selectively holds an arbitrary one of the plurality of plural-nozzle heads.

18. The apparatus according to claim 1, further comprising a single-nozzle head which holds a single suction nozzle holding an electronic component, wherein the head holding portion of the head holding member selectively holds an arbitrary one of the plural-nozzle head and the single-nozzle head.

* * * * *